US012751104B2

(12) United States Patent
Yang et al.

(10) Patent No.: US 12,751,104 B2
(45) Date of Patent: Sep. 29, 2026

(54) SIGNAL SHIELDING FOR INTEGRATED CIRCUITS

(71) Applicant: Taiwan Semiconductor Manufacturing Company, Ltd., Hsinchu (TW)

(72) Inventors: Hao-Lin Yang, Kaohsiung City (TW); Kuan-Chieh Huang, Hsinchu City (TW); Wei-Cheng Hsu, Kaohsiung City (TW); Tzu-Jui Wang, Fengshan City (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 588 days.

(21) Appl. No.: 18/297,177

(22) Filed: Apr. 7, 2023

(65) Prior Publication Data

US 2024/0339475 A1 Oct. 10, 2024

(51) Int. Cl.
*H10F 39/00* (2025.01)

(52) U.S. Cl.
CPC ......... *H10F 39/811* (2025.01); *H10F 39/018* (2025.01); *H10F 39/028* (2025.01);
(Continued)

(58) Field of Classification Search
CPC ... H01L 2224/0812; H01L 2224/80001; H01L 2224/0612; H01L 2224/06132;
(Continued)

(56) References Cited

U.S. PATENT DOCUMENTS 6,323,559 B1 * 11/2001 Chan ........................ H01L 24/81
257/E23.079
11,088,116 B2 * 8/2021 Wu ..................... H01L 25/0657
(Continued)

FOREIGN PATENT DOCUMENTS

JP 2017022207 A 1/2017

OTHER PUBLICATIONS

U.S. Appl. No. 18/193,777, filed Mar. 31, 2023.
(Continued)

*Primary Examiner* — David A Zarneke
(74) *Attorney, Agent, or Firm* — Eschweiler & Potashnik, LLC

(57) ABSTRACT

Some embodiments relate to an IC device, including a first chip; and a second chip bonded to the first chip at a bonding interface; where the first and second chips respectively comprise a first dielectric layer and a second dielectric layer directly contacting; the first chip further comprises a plurality of conductive pads recessed into the first dielectric layer and in a plurality of rows and columns; where the plurality of conductive pads are arranged with a zig-zag layout along the plurality of columns and along the plurality of rows and comprise a first conductive pad and a second conductive pad; the first chip further comprises a first shield line in the first dielectric layer and laterally between the first and second conductive pads, and the second chip further comprises a contact recessed into the second dielectric layer and directly contacting the first conductive pad at the bonding interface.

20 Claims, 23 Drawing Sheets

(52) U.S. Cl.
CPC ......... *H10F 39/809* (2025.01); *H10F 39/024* (2025.01); *H10F 39/8057* (2025.01)

(58) Field of Classification Search
CPC . H01L 2224/06133; H01L 2224/06515; H01L 2224/06517; H01L 2224/06519; H01L 23/552; H10F 39/018; H10F 39/1935; H10F 39/80; H10F 39/809; H10F 39/811; H10F 39/1515; H10F 39/8057
See application file for complete search history.

(56) References Cited

U.S. PATENT DOCUMENTS

| | | | | |
|---|---|---|---|---|
| 11,133,346 | B2 * | 9/2021 | Madurawe | H10F 39/18 |
| 11,393,781 | B2 * | 7/2022 | Watanabe | H01L 24/03 |
| 12,278,251 | B2 * | 4/2025 | Jang | H10F 39/8057 |
| 2013/0284885 | A1 | 10/2013 | Chen et al. | |
| 2017/0221950 | A1 | 8/2017 | Ho et al. | |
| 2019/0157333 | A1 | 5/2019 | Tsai | |
| 2020/0035737 | A1 | 1/2020 | Ito et al. | |
| 2020/0243473 | A1 | 7/2020 | Wang et al. | |
| 2022/0199670 | A1 | 6/2022 | Jang et al. | |
| 2023/0017688 | A1 | 1/2023 | Lai et al. | |
| 2023/0039809 | A1 | 2/2023 | Choi et al. | |

OTHER PUBLICATIONS

Get It 101. “Introduction to Camera Sensor 4T Structure” The date of publication is unknown. Retrieved online on Apr. 7, 2023 from https://www.getit01.com/p2018060144294l912.
Non-Final Office Action dated Feb. 19, 2026 for U.S. Appl. No. 18/193,777.
Notice of Allowance dated Jun. 5, 2026 for U.S. Appl. No. 18/193,777.

* cited by examiner

SIGNAL SHIELDING FOR INTEGRATED CIRCUITS

BACKGROUND

Many modern day electronic devices contain digital image sensors. Digital image sensors may be backside illumination sensors or frontside illumination sensors. Digital image sensors may utilize multi-chip packaging to lower the area needed per pixel and increase the resolution of the resulting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
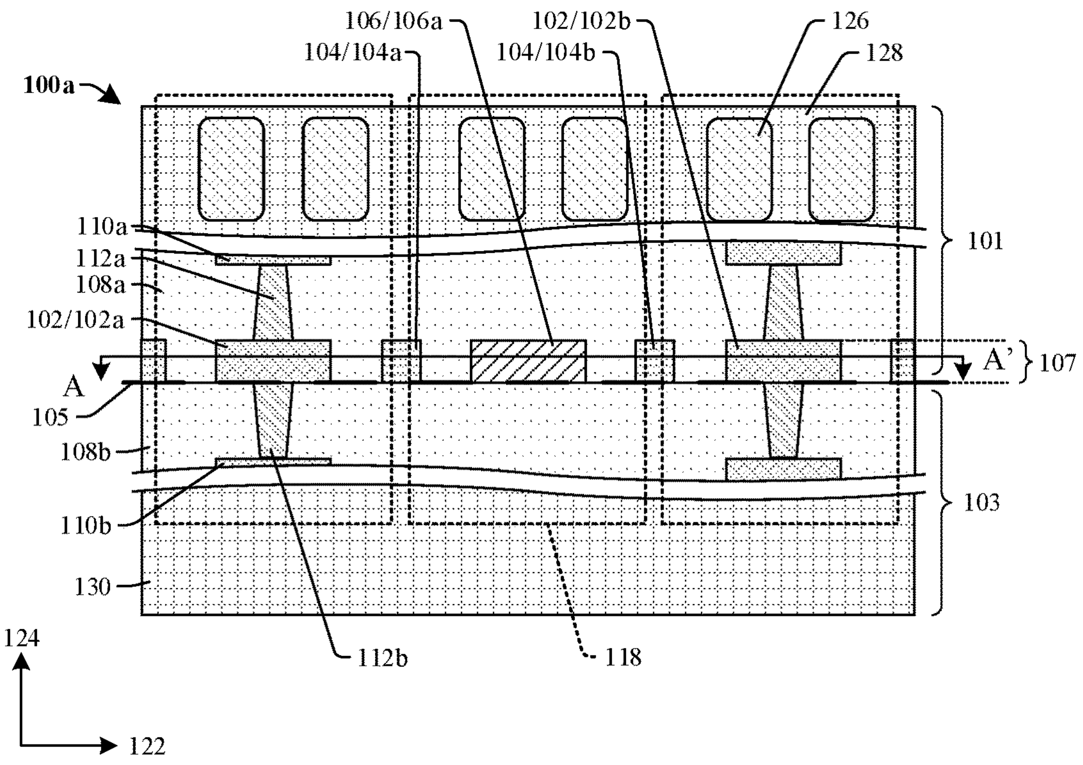
FIGS. 1A and 1B illustrate a cross-sectional view and a top layout view of some embodiments of an integrated circuit (IC) device comprising a metal-to-metal (M-M) and dielectric-to-dielectric (D-D) bonding layer with shield structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may comprise a pixel array, which comprises a plurality of pixels in a plurality of rows and a plurality of columns extending across one or more chips. The pixels comprise individual photodetectors in a substrate of a first integrated circuit (IC) chip. The pixels further comprise individual transfer transistors coupling the individual photodetectors to individual floating diffusion nodes in the substrate. The floating diffusion nodes are electrically coupled to an interconnect structure of a second IC chip through a metal-to-metal (M-M) and dielectric-to-dielectric (D-D) bonding layer. The M-M and D-D bonding layer comprises a plurality of conductive pads surrounded by a dielectric material.

The second IC chip accommodates a plurality of transistors individual to the pixels. These transistors include a plurality of source-follower transistors, a plurality of reset transistors, and a plurality of selection transistors which are configured to read the photodetectors and selectively pass the readings to an application specific integrated circuit (ASIC) on a third IC chip. Arranging the transistors at the second IC chip, rather than at the first IC chip, frees space on the first IC chip to allow shrinking of the pixels without reducing the size of the photodetectors. This, in turn, increases a maximum resolution of the image sensor and increases a quality of an image acquired from the image sensor.

During operation of the image sensor, charges are transferred from the individual photodetectors to gates of the plurality of source-follower transistors through the conductive pads within the M-M and D-D bonding layer. Due to a proximity of the conductive pads with respect to one another, there is a mutual inductance and mutual capacitance between the conductive pads. The mutual inductance and capacitance between conductive pads results in crosstalk between the conductive pads. The resulting crosstalk increases as the image sensor is scaled down and reduces the quality of the acquired image.

The present disclosure relates to an image sensor comprising a M-M and D-D bonding layer with shield structures. The shield structures separate conductive pads of the M-M and D-D bonding layer from each other and may, for example, be or comprise shield lines and/or dummy pads. A shield line extends across rows and/or columns of pixels to separate conductive pads from each other. A dummy pad separates conductive pads with a row or a column from each other. The shield structures are configured to interrupt electromagnetic fields and hence to reduce the mutual inductance and mutual capacitance between the conductive pads. Hence, the shield structures reduce crosstalk between the conductive pads and may enhance image quality.

Figure 1B:
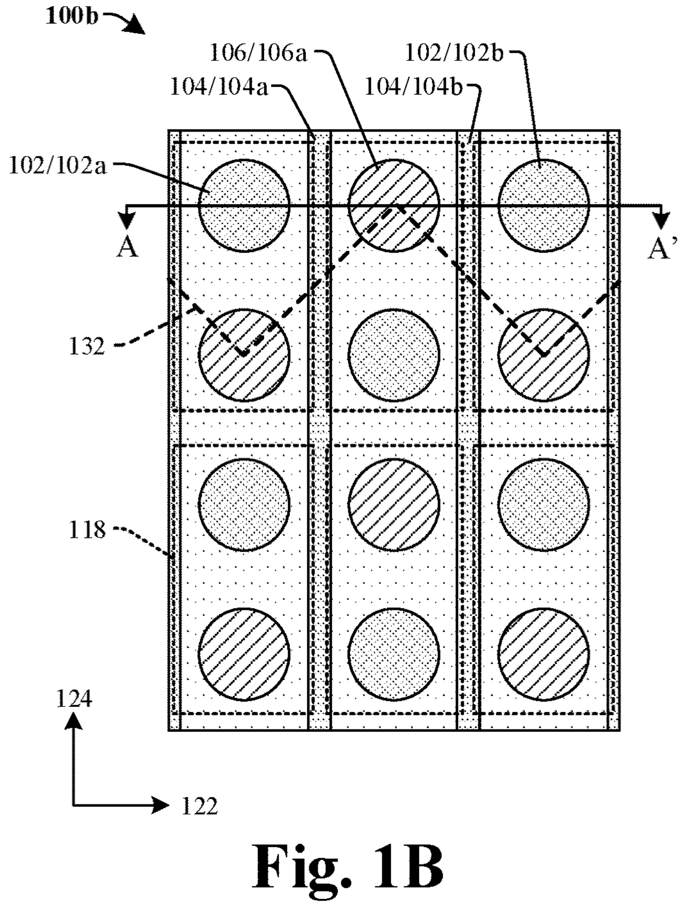

FIGS. 1A and 1B illustrate a cross-sectional view 100*a* and a top layout view 100*b* of some embodiments of an IC device comprising an M-M and D-D bonding layer with shield structures. The cross-sectional view 100*a* of FIG. 1A may, for example, be taken along line A-A' in FIG. 1B, and/or the top layout view 100*b* of FIG. 1B may, for example, be taken along line A-A' in FIG. 1A.

Focusing on FIG. 1A, a first IC chip 101 with a first M-M and D-D bonding layer 107 at a first bond interface 105 with a second IC chip 103. The first M-M and D-D bonding layer 107 comprises a first plurality of conductive pads 102 in the first IC chip 101. The first plurality of conductive pads 102 are electrically coupled to a first wire level 110*a* in the first IC chip 101 by a first plurality of bond contacts 112*a* in the first IC chip 101. Further, the first plurality of conductive pads 102 are electrically coupled to a second wire level 110*b* in the second IC chip 103 by a second plurality of bond contacts 112*b*. The second plurality of bond contacts 112*b* are in the second IC chip 103 and are bonded to the first plurality of conductive pads 102 at the first bond interface 105. The asymmetrical bonding of the first plurality of conductive pads 102 to the second plurality of bond contacts 112*b* may be desirable to lower the cost of production and lower the size and amount of mutual capacitance between adjacent conductive features.

In some embodiments, the first plurality of bond contacts 112*a*, the second plurality of bond contacts 112*b*, the first plurality of conductive pads 102, or any combination of the foregoing are or comprise copper (e.g., Cu), aluminum (e.g., Al), silver (e.g., Ag), gold (e.g., Au), another metal, the like, or any combination of the foregoing.

The first plurality of conductive pads 102 are surrounded by a first dielectric layer 108*a*, and the second plurality of bond contacts 112*b* are surrounded by a second dielectric layer 108*b*. Further, the first dielectric layer 108*a* and the second dielectric layer 108*b* are bonded to each other at the first bond interface 105. As such, the first bond interface 105 has a dielectric-to-dielectric bond interface and a metal-to-metal bond interface and is hence a hybrid or mix of the two bond interfaces.

In some embodiments, the first dielectric layer 108*a* is bonded to the second dielectric layer 108*b* through van der Waals forces. In some embodiments, the first dielectric layer 108*a* and the second dielectric layer 108*b* respectively comprise one or more separate dielectric materials. In some embodiments, the first dielectric layer 108*a* and the second dielectric layer 108*b* may be or comprise one of silicon oxide (e.g., $SiO_2$), silicon nitride (e.g., $Si_3N_4$), silicon oxynitride, another insulating material, the like, or any combination of the foregoing.

The first plurality of conductive pads 102 comprise a first conductive pad 102*a* and a second conductive pad 102*b*. The first conductive pad 102*a* is spaced from the second conductive pad 102*b* by a one or more shielding structures, including a first shield line 104*a*, a second shield line 104*b*, and a first dummy pad 106*a*. In alternative embodiments, one or more of the first shield line 104*a*, the second shield line 104*b*, and the first dummy pad 106*a* is/are omitted.

The first shield line 104*a* and the second shield line 104*b* correspond to a first plurality of shield lines 104. In some embodiments, the first plurality of shield lines 104 are conductive and are or comprise copper (e.g., Cu), silver (e.g., Ag), gold (e.g., Au), another metal or conductive material, the like, or any combination of the foregoing. In some embodiments, the first plurality of shield lines 104 are electrically grounded. In other embodiments, the first plurality of shield lines 104 are electrically biased. In yet other embodiments, the first plurality of shield lines 104 are electrically floating. In some embodiments, the first plurality of shield lines 104 are dielectric and are or comprise a low-k dielectric and/or the like. Use of a dielectric material for the first plurality of shield lines 104, instead of a conductive material, may, for example, reduce parasitic capacitance between the first conductive pad 102*a* and the second conductive pad 102*b*.

The first dummy pad 106*a* corresponds to one of a first plurality of dummy pads 106 (only one of which is shown). In some embodiments, the first plurality of dummy pads 106 are conductive and are or comprise copper (e.g., Cu), silver (e.g., Ag), gold (e.g., Au), another metal or conductive material, the like, or any combination of the foregoing. In some embodiments, the first dummy pad 106*a* are electrically floating. In some embodiments, the first plurality of dummy pads 106 are dielectric and are or comprise a low-k dielectric and/or the like. Use of a dielectric material for the first plurality of dummy pads 106, instead of a conductive material, may, for example, reduce parasitic capacitance between the first conductive pad 102*a* and the second conductive pad 102*b*.

Because the first conductive pad 102*a* is laterally separated from the second conductive pad 102*b* by the first shield line 104*a*, the second shield line 104*b*, and the first dummy pad 106*a*, mutual inductance and capacitance between the first conductive pad 102*a* and the second conductive pad 102*b* is reduced. This results in charge transferred by the second conductive pad 102*b* having a diminished effect on the first conductive pad 102*a* and vice versa. As a result, interference caused by the proximity of the first conductive pad 102*a* to the second conductive pad 102*b* is reduced, and an image acquired by the image sensor may have higher quality than would otherwise be possible.

During the bonding process, bubbles of gas may be trapped between the first dielectric layer 108*a* and the second dielectric layer 108*b*. The first plurality of shield lines 104 may help to discharge the bubbles of gas. Particularly, dishing may occur at the first plurality of shield lines 104 during manufacture. This may result in a cavity between the first plurality of shield lines 104 and the second dielectric layer 108*b*. This cavity may provide a path for the bubbles of gas to escape from between the first IC chip 101 and the second IC chip 103.

Focusing on both FIGS. 1A and 1B, a plurality of pixels 118 span the first IC chip 101 and the second IC chip 103. The plurality of pixels 118 are arranged in a plurality of pixel-block rows extending in a first direction 122 and a plurality of pixel-block columns extending in a second direction 124 perpendicular to the first direction 122.

The plurality of pixels 118 comprise corresponding photodetectors 126 on a first substrate 128 of the first IC chip 101 and corresponding pixel transistors (not shown) on a second substrate 130 of the second IC chip 103. A pixel of the plurality of pixels 118 may, for example, comprise 4 photodetectors (e.g., arranged in a 2×2 array), 8 photodetectors (e.g., arranged in a 2×4 array), or other similar values. A pixel transistor may, for example, be a select transistor, a source-follower transistor, a reset transistor, or the like.

The plurality of pixels 118 further respectively comprise one of the first plurality of conductive pads 102 and one of the one of the first plurality of dummy pads 106. The conductive pad of a pixel provides electrical coupling from the corresponding photodetectors 126 to the corresponding pixel transistors.

The first plurality of conductive pads 102 and the first plurality of dummy pads 106 are arranged in a plurality of pad rows extending in the first direction 122 and a plurality of pad columns extending in the second direction 124. Two neighboring pad rows correspond to one pixel-block row, whereas one pad column corresponds to one pixel-block column.

The first plurality of shield lines 104 are elongated along the pad columns and the pixel-block columns to separate the pixel-block columns from each other and to further separate the pad columns from each other. As a result, interference caused by the proximity of the first plurality of conductive pads 102 to each other in the first direction 122 is reduced. Further, an image acquired by the image sensor may have higher quality.

The first plurality of conductive pads 102 and the first plurality of dummy pads 106 are a same shape when viewed from a top view to enhance uniformity during manufacture. Further, the first plurality of conductive pads 102 and the first plurality of dummy pads 106 are interleaved, such that the first plurality of conductive pads 102 and the first plurality of dummy pads 106 alternate periodically along an axis extending in parallel to each of the pad rows and further alternate periodically along each of the pad columns. As a result, the first plurality of conductive pads 102 have a zig-zag layout 132 along the pad rows and the pad columns.

The zig-zag layout 132 increases separation between the first plurality of conductive pads 102. Further, the first plurality of dummy pads 106 shield interference between neighboring conductive pads in the pad rows and in the pad columns. The increased separation and the shielding reduce interference between the first plurality of conductive pads 102. Further, an image acquired by the image sensor may have higher quality.

Figure 2A:
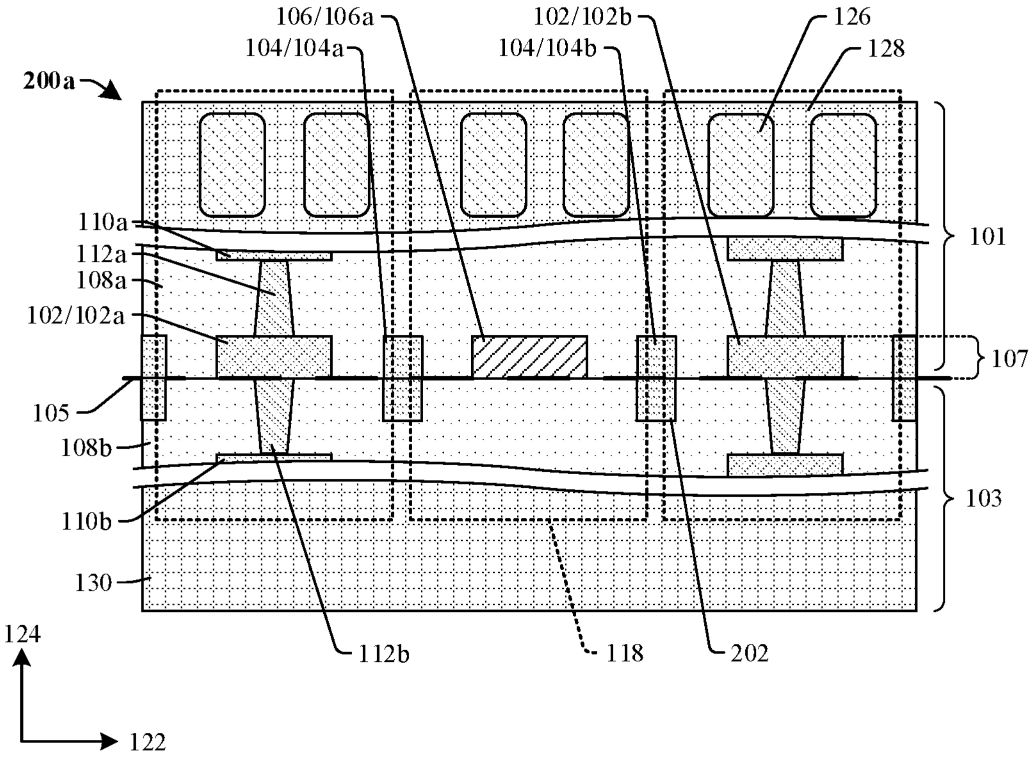
FIGS. 2A, 2B, and 2C illustrate cross-sectional views of alternative embodiments of the IC device of FIG. 1A.
Figure 2B:
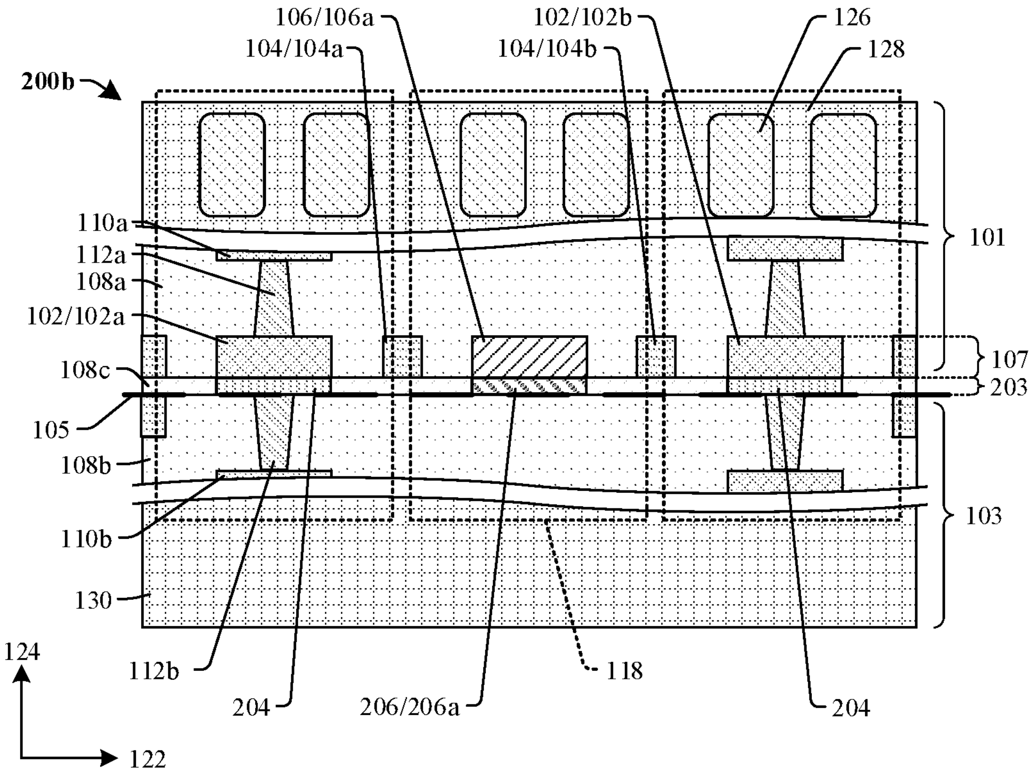
Figure 2C:
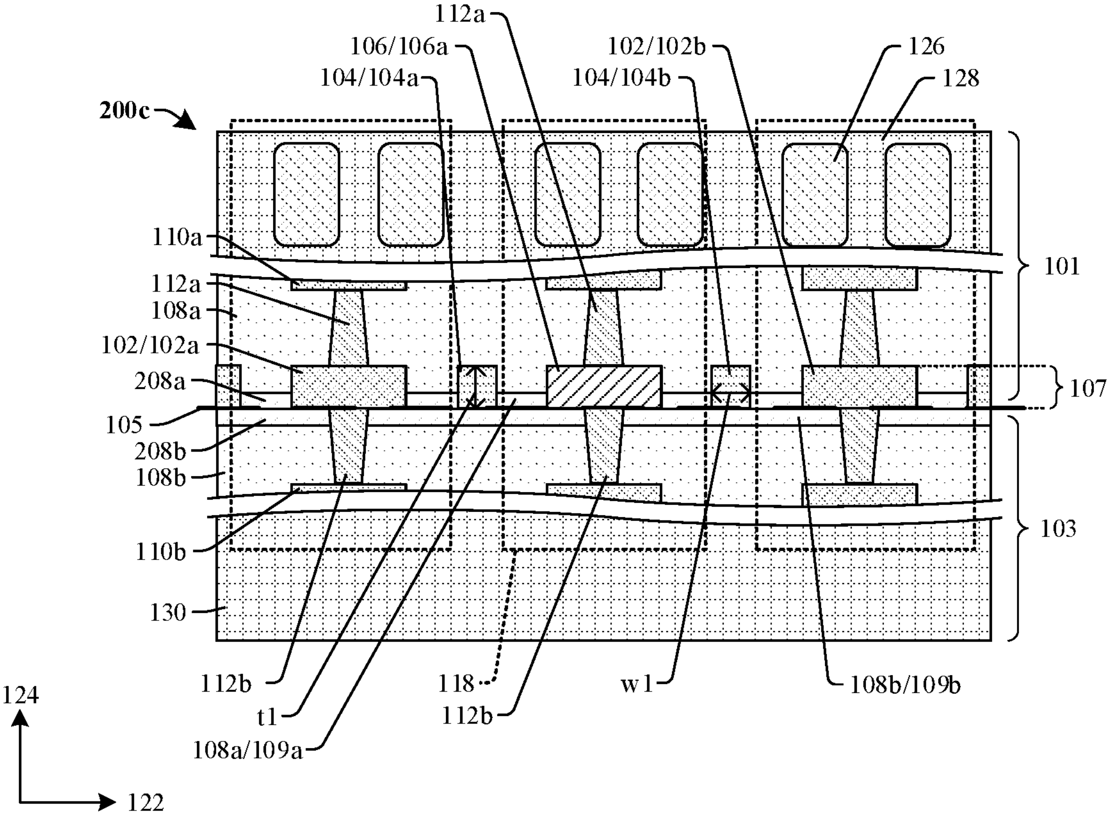

FIGS. 2A, 2B and 2C illustrate cross-sectional views of alternative embodiments of the IC device of FIG. 1A with additional detail.

As shown in the cross-sectional view 200*a* of FIG. 2A, in some embodiments, a second plurality of shield lines 202 are formed on the second IC chip 103. The second plurality of shield lines 202 are surrounded by the second dielectric layer 108*b*. Further, the second plurality of shield lines 202 match the first plurality of shield lines 104 along the first bond interface 105. In some embodiments, the second plurality of shield lines 202 have surfaces that are completely covered by the first plurality of shield lines 104. The inclusion of the second plurality of shield lines 202 results in a stronger bond between the first IC chip 101 and the second IC chip 103, as the first plurality of shield lines 104 bond more effectively to the second plurality of shield lines 202 than the second dielectric layer 108*b*.

As shown tin the cross-sectional view 200*b* of FIG. 2B, in some embodiments, a second M-M and D-D bonding layer 203 is directly beneath the first M-M and D-D bonding layer 107 and comprises a second plurality of conductive pads 204 and a second dummy pad 206*a*. In some embodiments, the second dummy pad 206*a* is one of a second plurality of dummy pads 206 (only one of which is shown). In some embodiments, a thickness of the first M-M and D-D bonding layer 107 is greater than or equal to a thickness of the second M-M and D-D bonding layer 203. In other embodiments, a thickness of the first M-M and D-D bonding layer 107 is less than a thickness of the second M-M and D-D bonding layer 203.

The second plurality of conductive pads 204 are directly and respectively beneath the first plurality of dummy pads 106, and the second dummy pad 206*a* is directly beneath the first dummy pad 106*a*. The second plurality of conductive pads 204 are bonded respectively to the second plurality of bond contacts 112*b* at the first bond interface 105. The first plurality of shield lines 104 are spaced from the first bond interface 105 by a third dielectric layer 108*c* in the second M-M and D-D bonding layer 203. In some embodiments, a bottom surface of the first plurality of shield lines 104 is level with a top surface of the second M-M and D-D bonding layer 203.

The third dielectric layer 108*c* bonds more effectively to the second dielectric layer 108*b* than the first plurality of shield lines 104. Therefore, because the second M-M and D-D bonding layer 203 spaces the first plurality of shield lines 104 from the first bond interface 105, a better bonding between the first IC chip 101 and the second IC chip 103 results.

As shown in the cross-sectional view 200*c* of FIG. 2C, in some embodiments, the first plurality of dummy pads 106 may be coupled to the first plurality of bond contacts 112*a* in the first IC chip 101 and also to the second plurality of bond contacts 112*b* in the second IC chip 103. The first plurality of bond contacts 112*a* may be further coupled to the first wire level 110*a*, and the second plurality of bond contacts 112*b* may be further coupled to the second wire level 110*b*. In some embodiments, the first plurality of dummy pads 106 are grounded or electrically biased through the first wire level 110*a* and/or the second wire level 110*b*. Grounding or biasing the first plurality of dummy pads 106 may further reduce the degree of electromagnetic interference present between the first plurality of conductive pads 102.

In some embodiments, the first plurality of shield lines 104 have a first thickness t1 approximately between 2000 angstroms and 5000 angstroms, approximately between 1500 angstroms and 3100 angstroms, approximately between 2500 angstroms and 5500 angstroms, or within another suitable range. In some embodiments, individual shield lines of the first plurality of shield lines 104 have a first width w1 approximately between 1000 angstroms and 2000 angstroms, approximately between 800 angstroms and 1800 angstroms, approximately between 1200 angstroms and 2200 angstroms, or within another suitable range.

In some embodiments, a first dielectric material 208*a* and a second dielectric material 208*b* are present at the first bond interface 105. The first dielectric material 208*a* is part of the first dielectric layer 108*a*, and the second dielectric material 208*b* is part of the second dielectric layer 108*b*. In some embodiments, the first dielectric material 208*a* and the second dielectric material 208*b* may be or comprise one of silicon oxide (e.g., $SiO_2$), silicon nitride (e.g., $Si_3N_4$), silicon oxynitride, another insulating material, the like, or any combination of the foregoing. In further embodiments, other portions of the first dielectric layer 108*a* and the second dielectric layer 108*b* comprise dielectric materials different from the first dielectric material 208*a* and the second dielectric material 208*b*. The addition of the first dielectric material 208*a* and the second dielectric material 208*b* may result in a greater bond strength between the first IC chip 101 and the second IC chip 103.

Figure 3A:
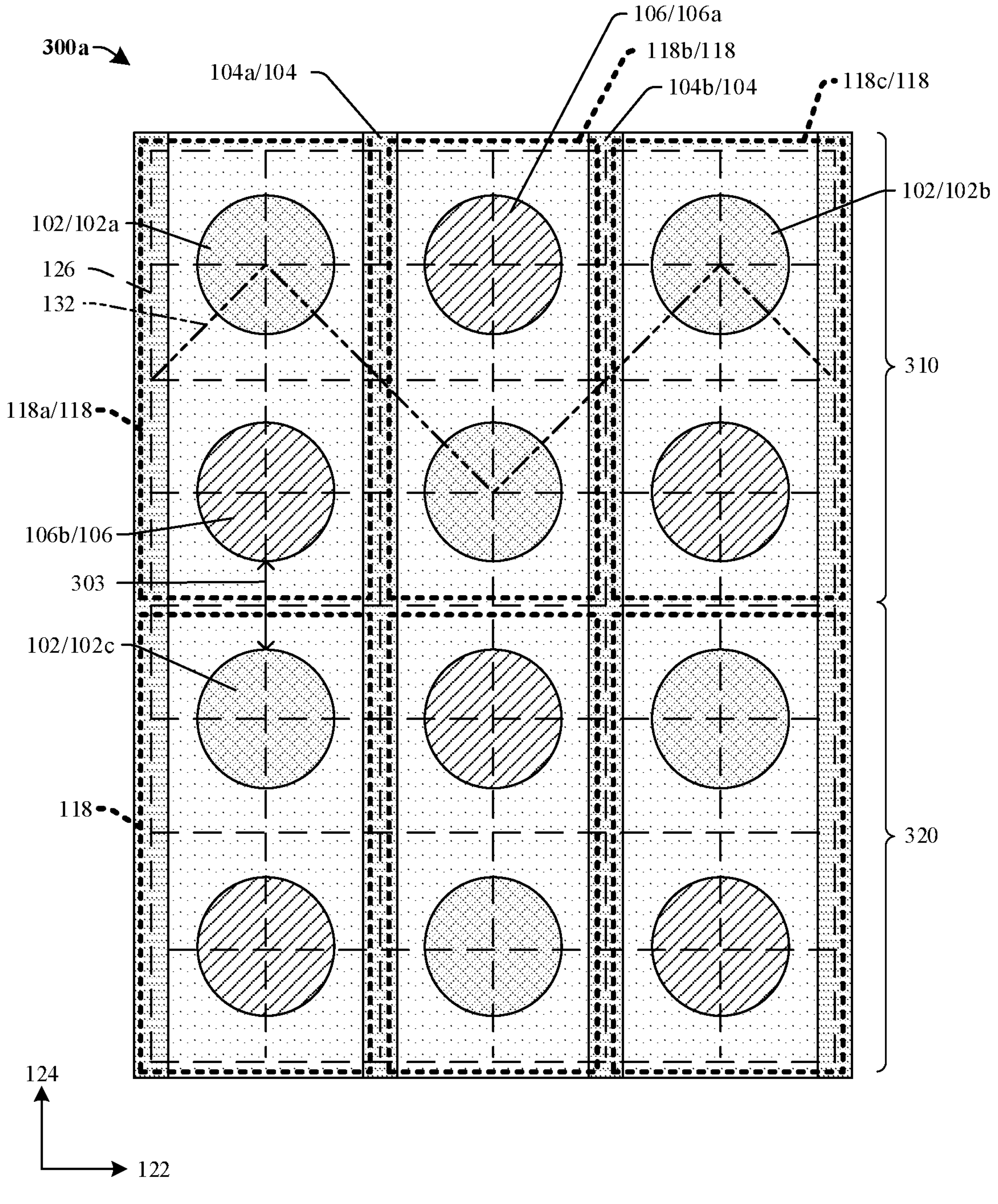
FIG. 3A illustrates a top layout view of the IC device of FIG. 1B with additional detail.
Figure 3B:
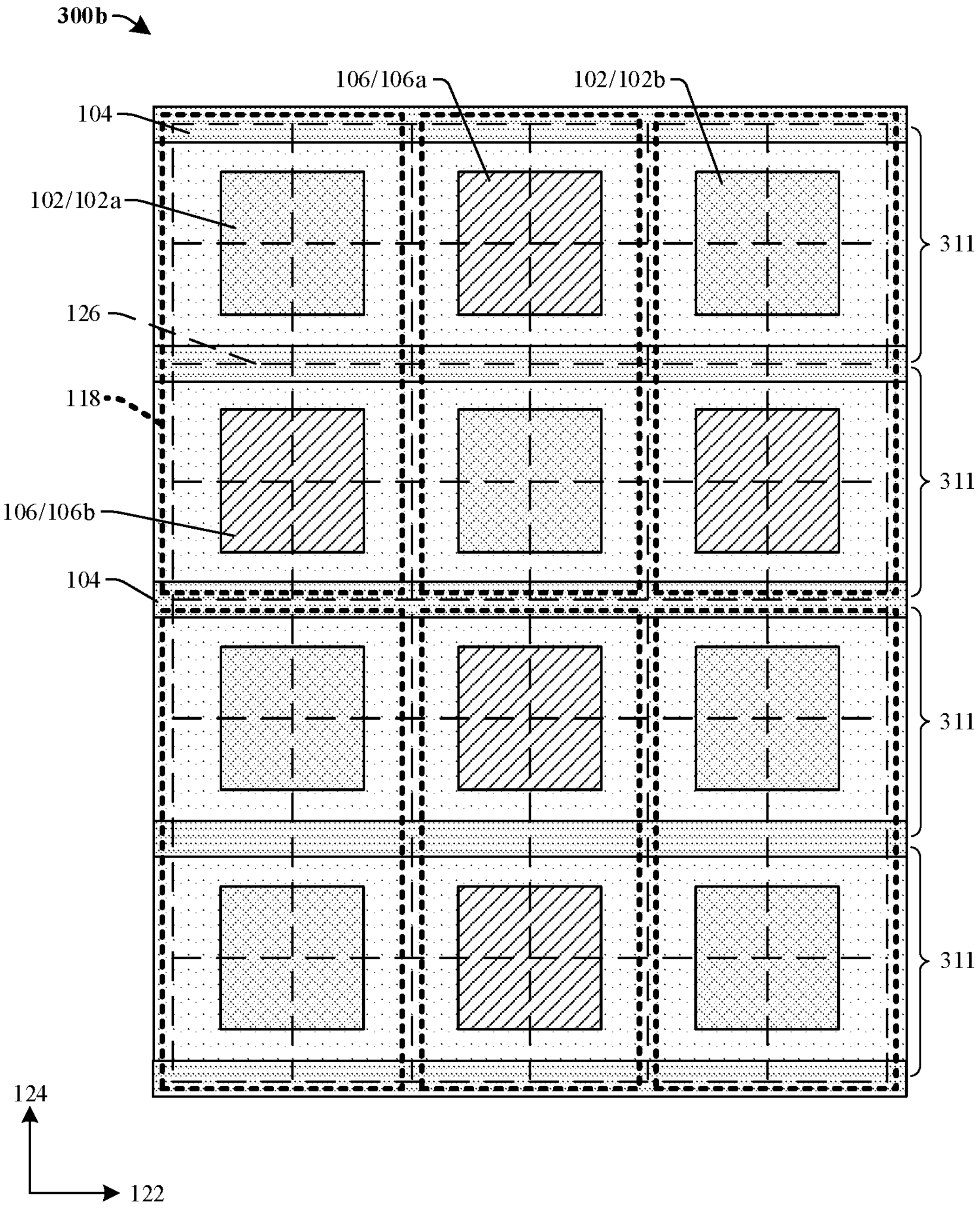
FIGS. 3B, 3C, 3D, and 3E illustrate top layout views of alternative embodiments of the IC device of FIG. 3A.
Figure 3C:
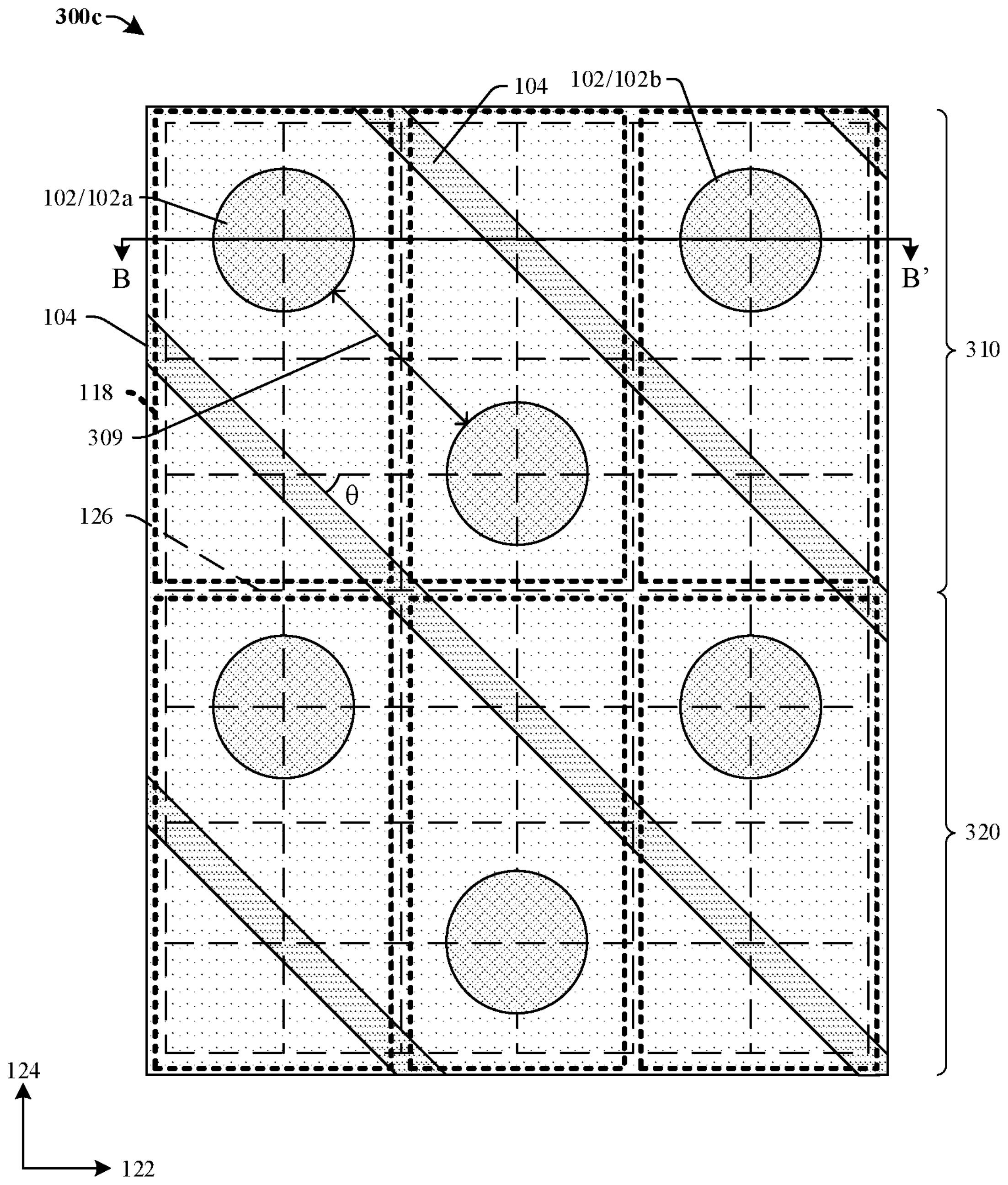

FIGS. 3A, 3B, 3C. 3D, and 3E illustrate top layout views of alternative embodiments of the IC device of FIG. 1B with additional detail.

As shown in the top layout view 300*a* of FIG. 3A, an array of photodetectors 126 (in phantom) overlies the conductive pads 102. The array of photodetectors 126 is such that four photodetectors are in a 2-by-2 subarray and are directly above each individual conductive pad 102 and each individual dummy pad 106.

Groups of eight photodetectors form the pixels 118. Each pixel overlies and is coupled to a single one of the first plurality of conductive pads 102 and further overlies a single one of the first plurality of dummy pads 106. For example, a first pixel 118*a* overlies and is coupled to the first conductive pad 102*a* and further overlies a third dummy pad 106*c*. The eight photodetectors of the first pixel 118*a* are coupled to the first conductive pad 102*a* through two floating diffusion nodes (not shown) respectively positioned directly over the first conductive pad 102*a* and the third dummy pad 106*c*. A second pixel 118*b* and a third pixel 118*c* are also in a first pixel-block row 310. The conductive pads 102 in the first pixel-block row 310 are offset from one another in a zig-zag layout 132.

During operation, eight read-out operations are performed per pixel. Further, the first, second, and third pixels 118*a*-118*c* in the first pixel-block row 310 are read in parallel during the eight read out operations, and then pixels in a second pixel-block row 320 below first pixel-block row 310 are read in parallel. Based on this pattern of read-out operations, the conductive pads 102 in the first pixel-block row 310 are operating simultaneously and transferring a charge to the second IC chip 103 (see, e.g., FIG. 1A).

The zig-zag layout 132 of the conductive pads 102 increases the distance between the conductive pads 102. Because the strength of an electric field caused by charge is inversely proportional to the square of a distance from the charge, increasing the distance between the conductive pads 102 lowers the strength of the electromagnetic field effects and interference caused by the simultaneous charge transfer. The first plurality of shield lines 104 and the first plurality of dummy pads 106 also reduce the mutual inductance and capacitance between the conductive pads 102. The combination of the increased distance and the conductive obstacles results in a first M-M and D-D bonding layer 107 (see, e.g., FIG. 1A) with reduced interference between the conductive pads 102 without lowering the resolution of the pixel array.

A third conductive pad 102*c* is spaced from the second conductive pad 102*b* by the first shield line 104*a* and the second shield line 104*b*, and a line extending between the first conductive pad 102*a* and the third conductive pad 102*c* is parallel to the first shield line 104*a*. In further embodiments, a second dummy pad 106*b* is directly between the first conductive pad 102*a* and the third conductive pad 102*c*. In some embodiments, the first plurality of conductive pads 102 and the first plurality of dummy pads 106 are separated from each other by a distance 303. In further embodiments, a dummy pad 106 is equidistant from four conductive pads of the plurality of conductive pads 102.

As shown in the top layout view 300*b* of FIG. 3B, in some embodiments, the first plurality of shield lines 104 extends between rows of 2-by-2 subarrays 311 instead of between columns of pixels. Further, the conductive pads 102 are a square shape when viewed from a top view. In alternative embodiments, the conductive pads 102 are circular or have some other suitable layout when viewed from a top view. In further embodiments, the dummy pads 106 have a same top geometry as the conductive pads 102. In some embodiments, the zig-zag layout (132 of FIG. 3A) spans two neighboring rows of 2-by-2 subarrays 311, and wherein conductive pads 102 alternate between the two neighboring rows from column to column.

As shown in the top layout view 300*c* of FIG. 3C, in some embodiments, the first plurality of shield lines 104 extend at a 45-degree angle θ to the first direction 122 (e.g., along the first pixel-block row 310). In further embodiments, the first plurality of dummy pads (e.g., 106 of FIG. 1B) are not present between the conductive pads 102. The conductive pads are either separated by the first plurality of shield lines 104 or a distance 309. The distance 309 is greater than the distance 303 (see, e.g., FIG. 3A) between the first plurality of conductive pads 102 and the first plurality of dummy pads 106.

In some embodiments, the proximity of the first plurality of shield lines 104 to the first plurality of conductive pads 102 may cause a parasitic capacitance between the structures. In high resolution applications, the parasitic capacitance may lower the conversion gain (uV/e) significantly. However, when the first plurality of shield lines 104 extend at a 45-degree angle θ to the first direction 122, a distance between the first plurality of conductive pads 102 and the first plurality of shield lines 104 increases, thereby reducing the parasitic capacitance and increasing the conversion gain of the pixels.

Figure 3D:
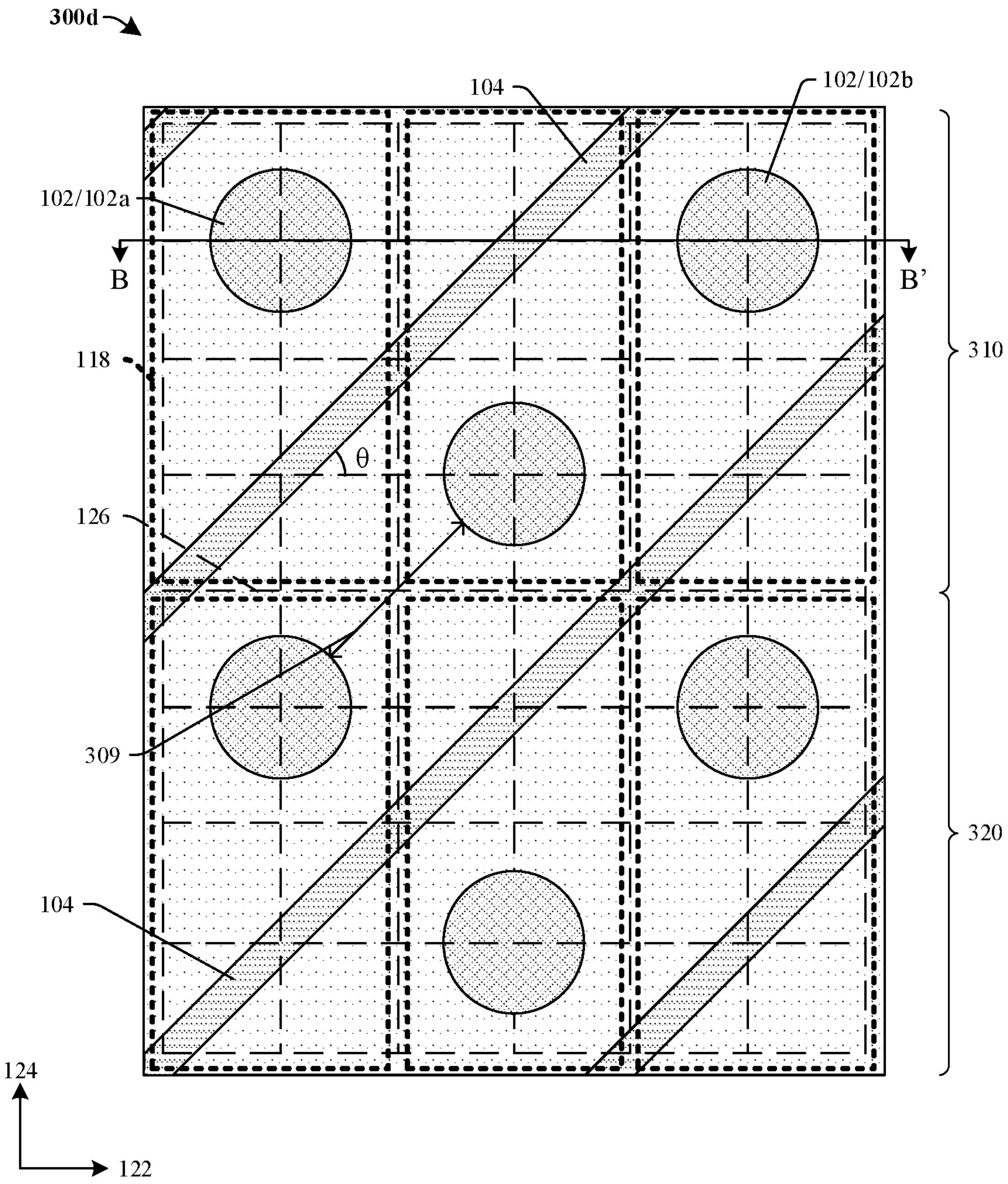

As shown in the top layout view 300*d* of FIG. 3D, in some embodiments, the first plurality of shield lines 104 extend at a −45-degree angle θ to the first direction 122.

Figure 3E:
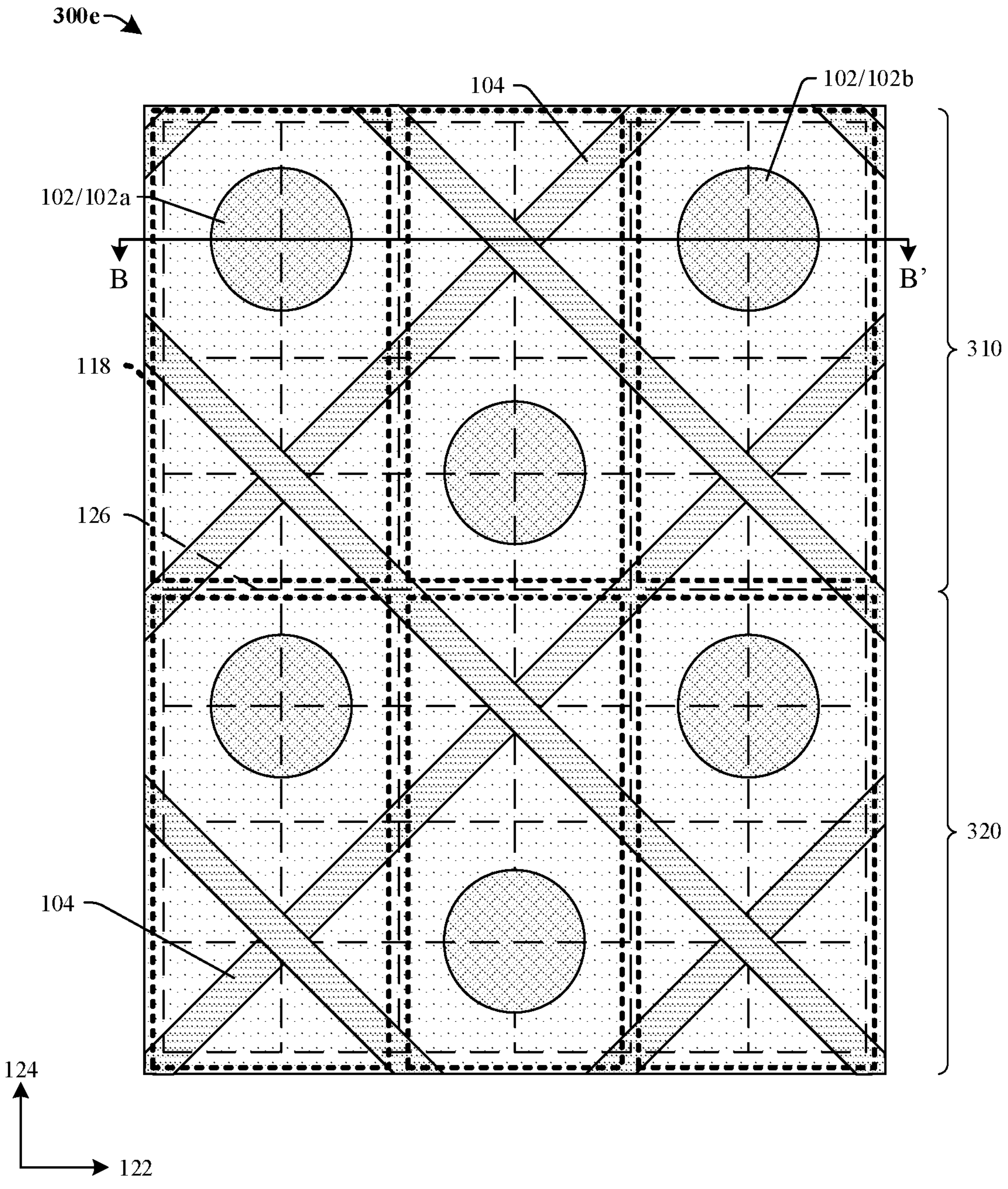

As shown in the top layout view 300*e* of FIG. 3E, in some embodiments, the first plurality of shield lines 104 extends between the conductive pads 102 at both a 45 degree angle and a −45 degree angle, whereby the conductive pads 102 are further isolated from one another by the first plurality of shield lines 104. This may further reduce the crosstalk between the conductive pads 102 but may also increase the parasitic capacitance between the conductive pads 102 and the shield lines 104.

Figure 3F:
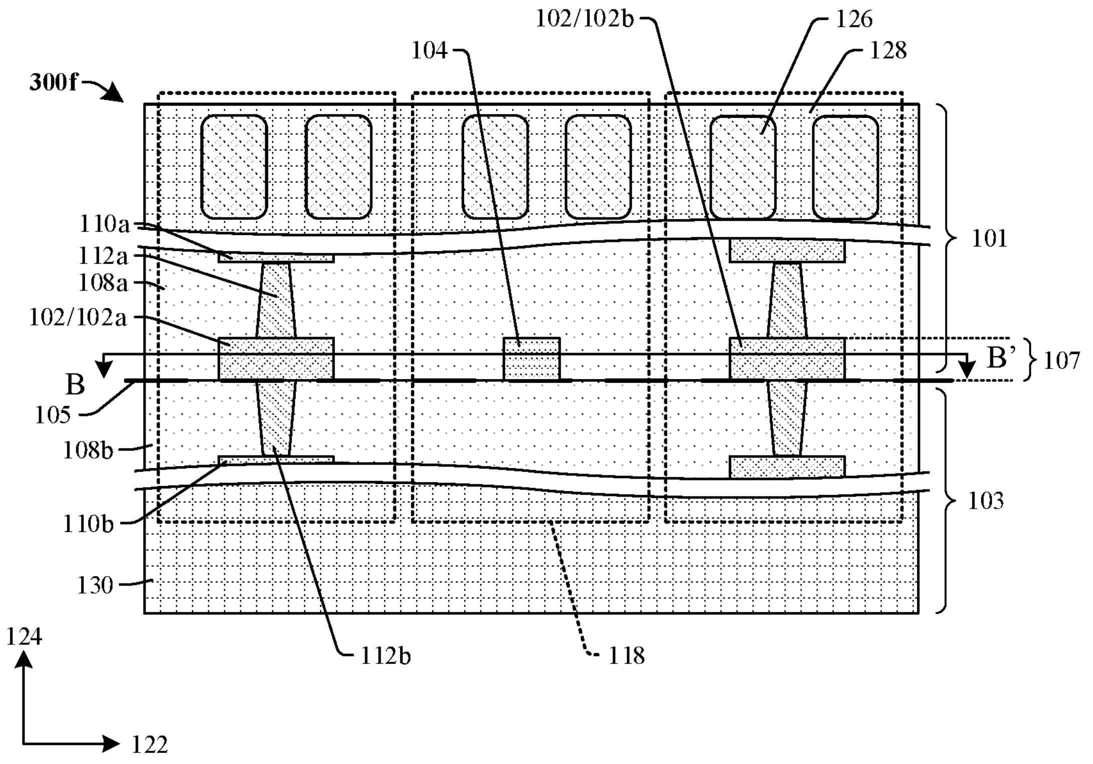
FIG. 3F illustrates a cross-sectional view of the IC device of FIGS. 3C, 3D, and 3E.

FIG. 3F illustrates a cross-sectional view 300*f* of the IC device of FIGS. 3C, 3D, and 3E. The top layout views 300C-300E of FIGS. 3C-3E may, for example, be taken along line B-B' in the cross-sectional view 300*f*, and the cross-sectional view 300*f* may, for example, be taken along line B-B' in the top layout views 300C-300E.

The first conductive pad 102*a* and the second conductive pad 102*b* are separated by distance and isolated by the first plurality of shield lines 104. In some embodiments, the second plurality of shield lines 202 (see, e.g., FIG. 2A) may be bonded to the first plurality of shield lines 104 to improve the bonding strength of the first bond interface 105 and to reduce the amount of bubbles present at the first bond interface 105. In other embodiments, the first M-M and D-D bonding layer 107 may be as described with regard to FIGS. 2B and 2C.

Figure 4A:
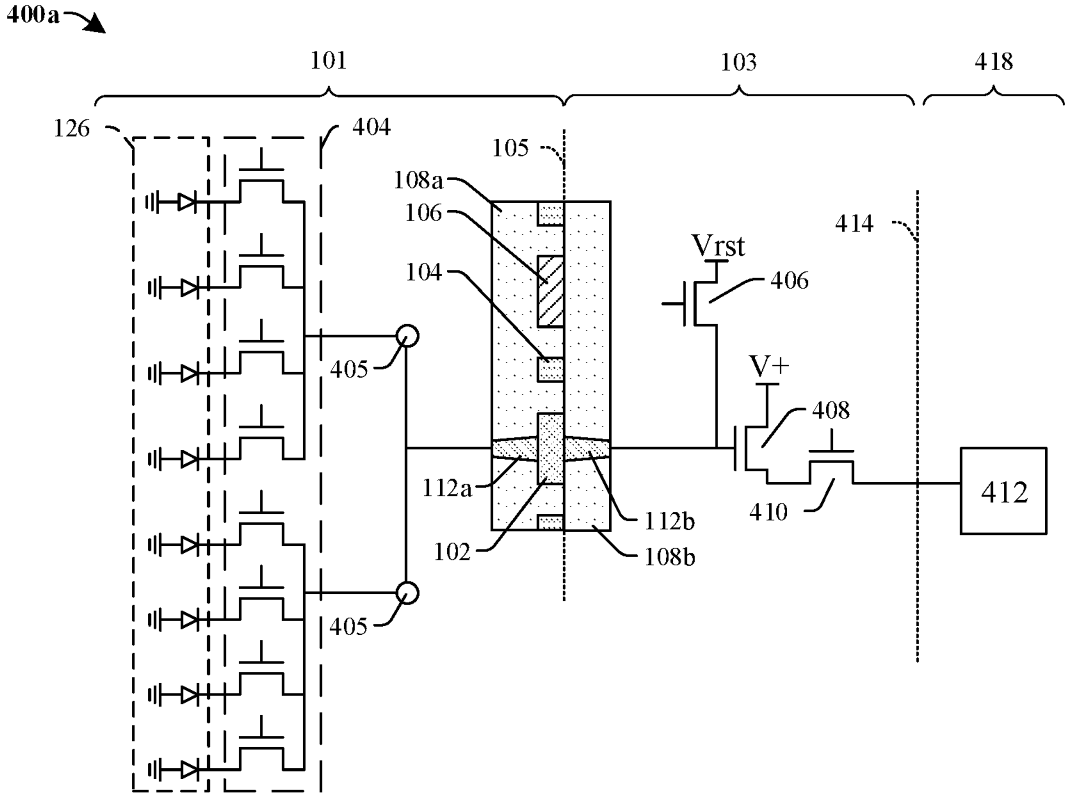
FIGS. 4A and 4B illustrate circuit diagrams of some embodiments of an IC device with a 2-by-4 array of photodetectors in a first IC chip and connected to a second IC chip through a bonding interface.
Figure 4B:
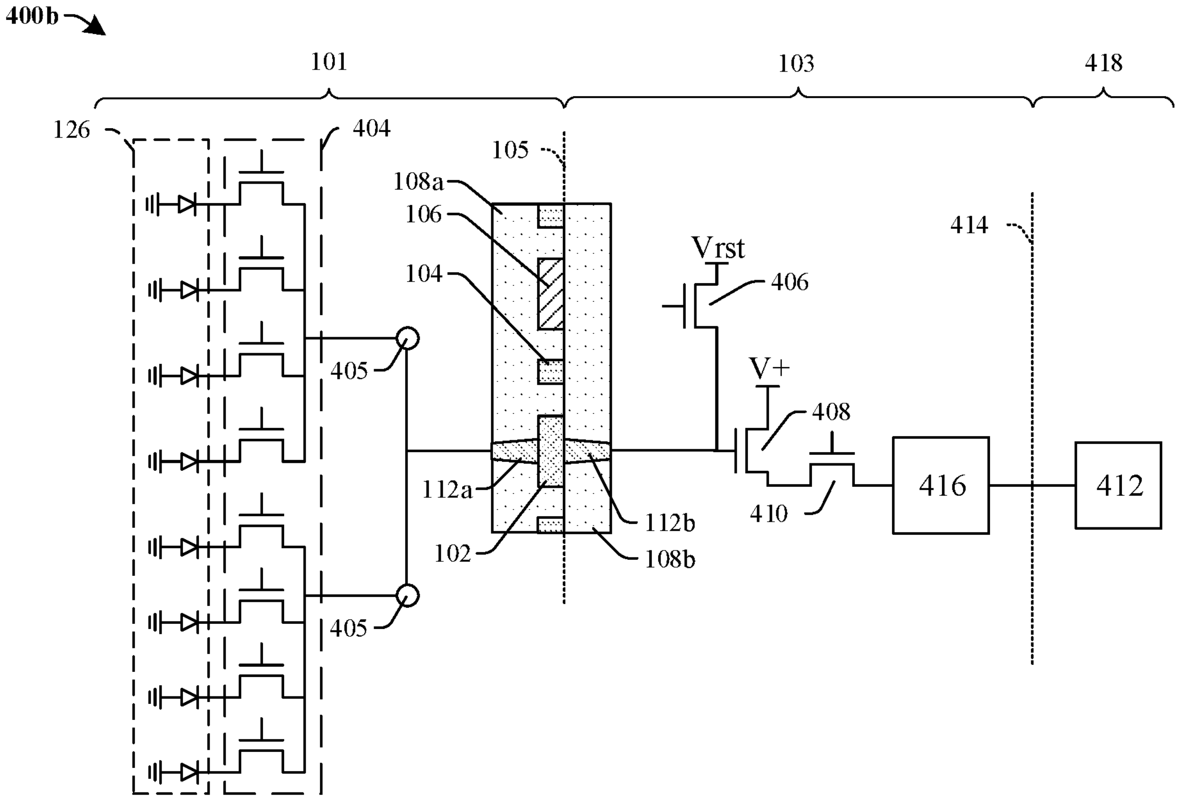

FIGS. 4A and 4B illustrate circuit diagrams of some embodiments of an IC device with a 2-by-4 array of photodetectors in a first IC chip and connected to a second IC chip through a bonding interface. The 2-by-4 array of photodetectors may, for example, correspond to the first pixel 118*a* in FIG. 3A.

As shown in the circuit diagram 400*a* of FIG. 4A, eight photodetectors 126 are electrically coupled to floating diffusion nodes 405 through eight transfer transistors 404. The floating diffusion nodes 405 are coupled to a source-follower transistor 408 through the first bond interface 105. In some embodiments, there are two floating diffusion nodes 405 per source-follower transistor 408, and the eight photodetectors 126 are evenly distributed between the two floating diffusion nodes 405. For example, the eight photodetectors 126 may be grouped into two 2-by-2 subarrays corresponding to the floating diffusion nodes 405. A reset transistor 406 selectively couples the floating diffusion nodes 405 to a reset voltage Vrst to reset the floating diffusion nodes 405 in order to perform additional measurements. The source-follower transistor 408 is coupled to a select transistor 410, which controls the transfer of a signal corresponding to the measured photocurrent of the photodetectors 126 to an ASIC 412 on a third IC chip 418. The third IC chip 418 is bonded to the second IC chip 103 through a second bond interface 414.

As shown in the circuit diagram 400*b* of FIG. 4B, in some embodiments, an in-pixel circuit 416 is present in the second IC chip 103. The in-pixel circuit 416 may further process the signal before it travels across the second bond interface 414 to the ASIC 412.

Figure 5A:
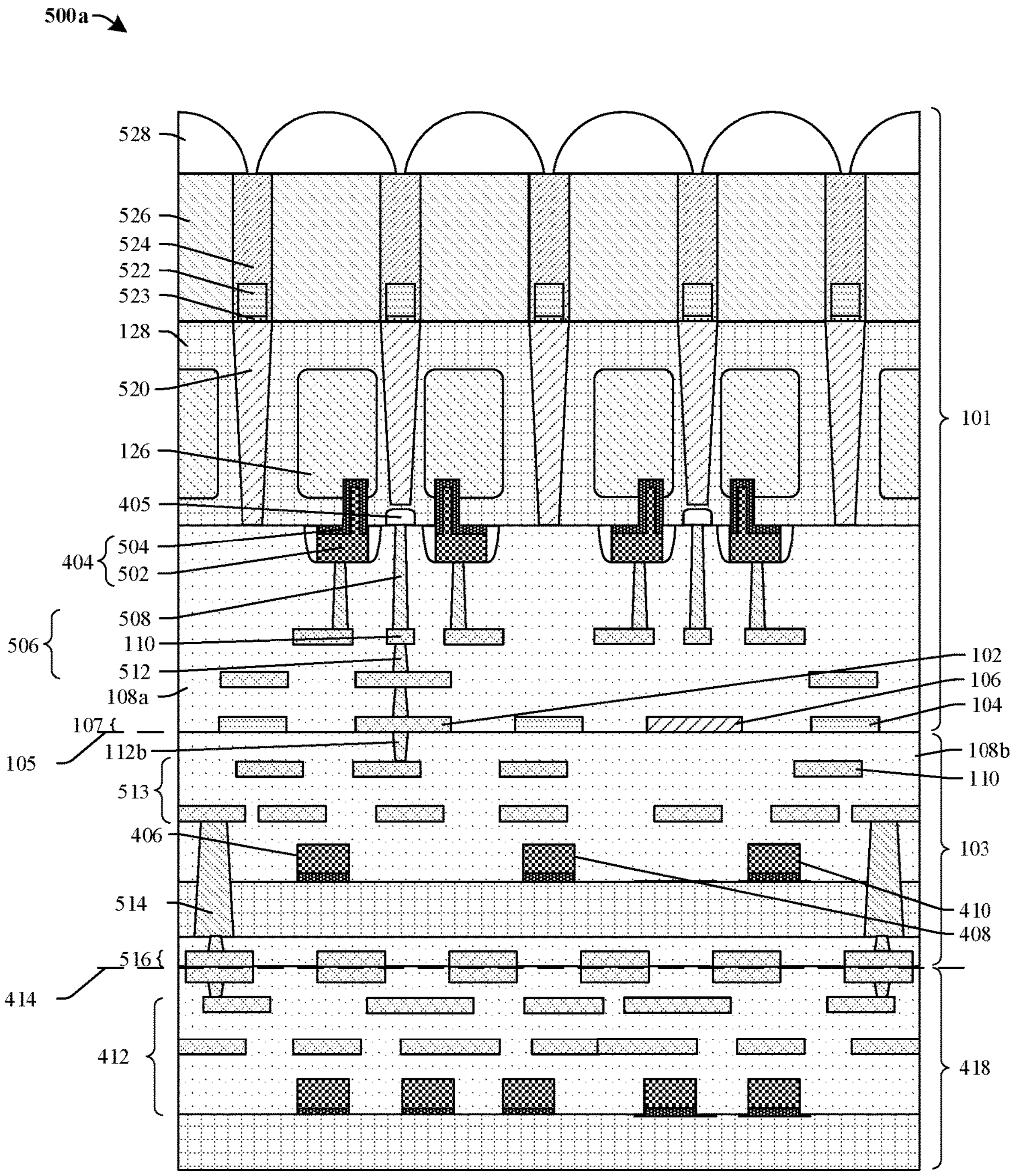
FIGS. 5A, 5B, and 5C illustrate cross-sectional-views of some embodiments of an IC device comprising an M-M and D-D bonding layer with shield structures at a bond interface.
Figure 5B:
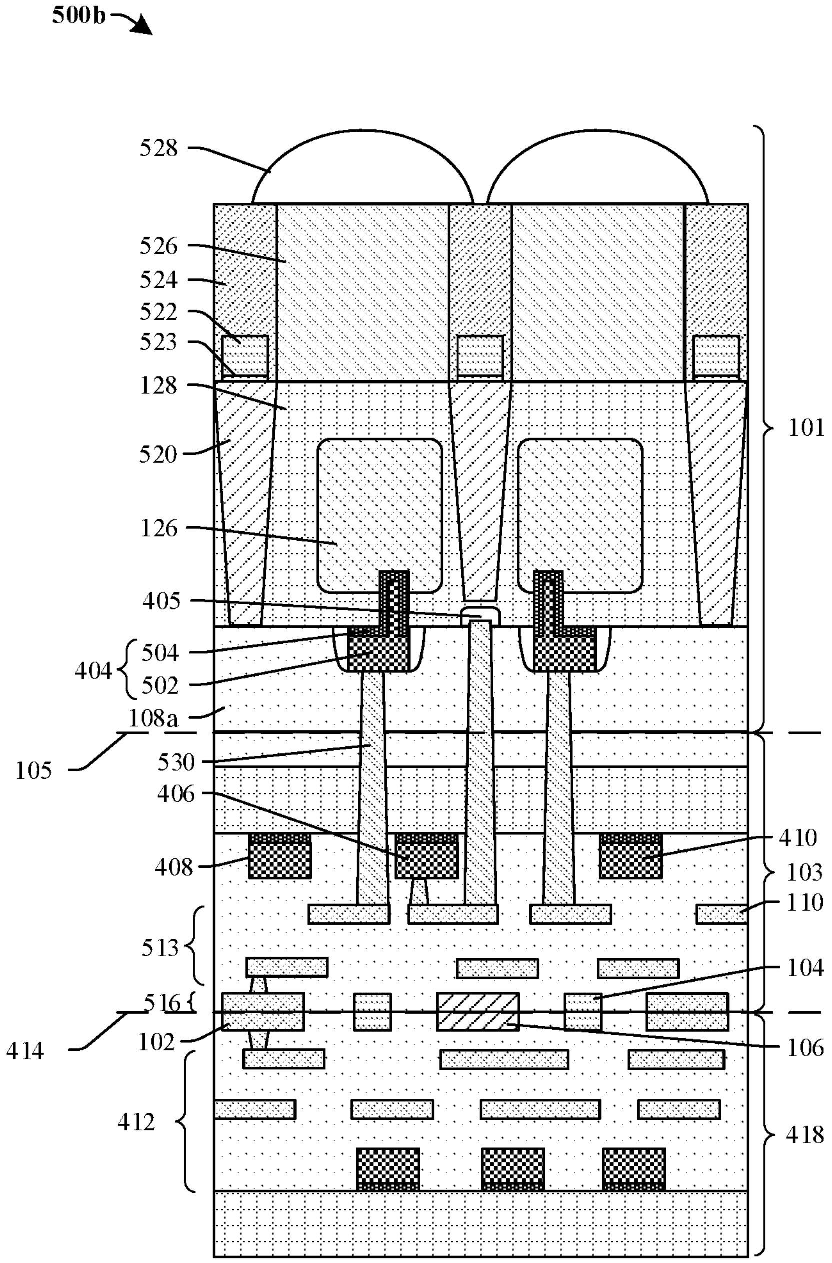
Figure 5C:
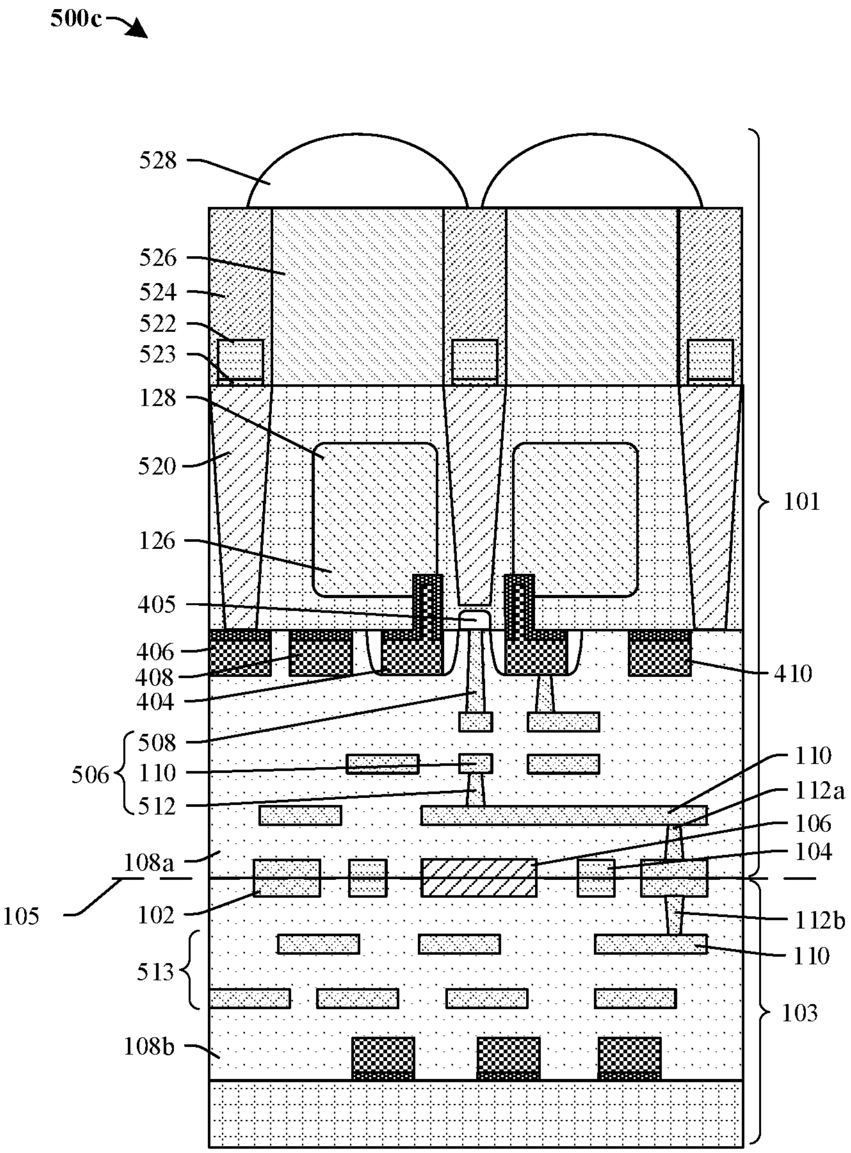

FIGS. 5A, 5B, and 5C illustrate cross-sectional-views of some embodiments of an IC device comprising an M-M and D-D bonding layer with shield lines at a bond interface.

As shown in the cross-sectional view 500*a* of FIG. 5A, the first IC chip 101, the second IC chip 103, and the third IC chip 418 are bonded together at a first bond interface 105 and a second bond interface 414. A pixel is illustrated, with components individual to the pixel within the first IC chip 101 and the second IC chip 103. As described in relation to FIG. 4A, the transfer transistors 404 couple the photodetectors 126 to the floating diffusion nodes 405 (only one of which is shown). The transfer transistors 404 comprise individual gate electrodes 502 and individual gate dielectrics 504 that are stacked respectively with the gate electrodes 502 to form gate stacks. Further, the transfer transistors 404 comprise individual source/drain regions in a first substrate 128. In some embodiments, the first substrate 128 is or comprises one of a bulk semiconductor, a semiconductor-on-insulator (SOI) substrate, or the like, which may be doped (e.g., with a p-type or an n-type dopant) or undoped. The source/drain regions include collector regions of the photodetectors 126 and the floating diffusion nodes 405. Source/drain region(s) may refer to a source or a drain, individually or collectively dependent upon the context.

The application of a bias voltage to the gate electrodes 502 of the transfer transistors 404 forms channels between the photodetectors 126 and the floating diffusion nodes 405, providing a path for a photocurrent to flow. The photocurrent flows from the floating diffusion nodes 405 to the second IC chip 103 through a first interconnect structure 506.

The first interconnect structure 506 comprises contacts 508 extending from the floating diffusion nodes 405. The first interconnect structure 506 further comprises a plurality of wire levels 110 and a plurality of vias 512 alternatingly stacked from the contact 508 to the first plurality of bond contacts 112*a* (only one of which is shown). The plurality of wire levels 110 and the plurality of vias 512 are alternatingly stacked into conductive paths. The plurality of wire levels 110 provide lateral routing between the plurality of vias 512. The plurality of vias 512 provide vertical routing between the plurality of wire levels 110.

In some embodiments, the contacts 508 (only one of which is shown), the plurality of wire levels 110, the plurality of vias 512, or any combination of the foregoing are or comprise polysilicon, copper (e.g., Cu), titanium nitride (e.g., TiN), tungsten (e.g., W), aluminum (e.g., Al), tantalum nitride (e.g., TaN), the like, or any combination of the foregoing. In some embodiments, the first plurality of bond contacts 112*a*, the first plurality of conductive pads 102, or any combination of the foregoing are or comprise copper (e.g., Cu), silver (e.g., Ag), gold (e.g., Au), another metal, the like, or any combination of the foregoing.

A second plurality of bond contacts 112*b* extend from the first plurality of conductive pads 102 to a second interconnect structure 513. Further, the second interconnect structure 513 extends from the second plurality of bond contacts 112*b* to the reset transistor 406, the source-follower transistor 408, and the select transistor 410. The second plurality of bond contacts 112*b* may, for example, be as the first plurality of bond contacts 112*a* are described. Further, the second interconnect structure 513 may, for example, be as the first interconnect structure 506 is described other than layout and/or numbers of conductive features.

The second interconnect structure 513 is electrically coupled to the ASIC 412 on the third IC chip 418 through through-substrate vias (TSVs) 514. The TSVs 514 are coupled to the third IC chip 418 through additional M-M and D-D bonding layers 516 at the second bond interface 414. In some embodiments, a second interconnect structure 513 may be or comprise a same material as the first interconnect structure 506. The additional M-M and D-D bonding layers 516 may, for example, be as the first M-M and D-D bonding layer 107 is described other than layout and/or numbers of conductive pads.

In some embodiments, the photodetectors 126 are separated from one another by backside deep trench isolation (BDTI) structures 520. A backside metal grid (BSMG) 522 overlies the BDTI structures 520 and is surrounded a grid of dielectric material 524. In some embodiments, a barrier layer 523 is between the BSMG 522 and the BDTI structure 520. A plurality of color filters 526 is disposed within the grid of dielectric material 524 and overlies the photodetectors 126. In further embodiments, a plurality of micro-lenses 528 are disposed over the color filters 526. The color filters 526 and the micro-lenses 528 are arranged in a plurality of rows and a plurality of columns, respectively overlying the photodetectors 126.

As shown in the cross-sectional view 500*b* of FIG. 5B, in some embodiments, the first IC chip 101 is electrically coupled to the second IC chip 103 through a plurality of through-substrate contacts 530 extending through the first bond interface 105. As such, the connections made in FIG. 5A by the first interconnect structure (e.g., 506 of FIG. 5A) are instead made in the second interconnect structure 513. The device of FIG. 5B may benefit from the first plurality of shield lines 104 and the first plurality of dummy pads 106 isolating connections between the second IC chip 103 and the third IC chip 418.

As shown in the cross-sectional view 500*c* of FIG. 5C, in some embodiments, in a two chip configuration, the first plurality of shield lines 104 and the first plurality of dummy pads 106 may isolate connections between the first IC chip 101 and the second IC chip 103. This may lower the interference between conductive pads 102 at the first bond interface 105.

Although FIG. 1A to FIG. 5C are described in relation to an image sensor integrated chip, it will be appreciated that the disclosed shield structures (e.g., the shield lines 104 and the dummy pads 106) are not limited to such embodiments. Rather, the disclosed shield structures may be applicable in any integrated chip structure comprising an array of conductive bond pads that are arranged in a periodic pattern and that transfer charge in parallel.

FIGS. 6-12, 13A, 13B, and 14-18 illustrate a series of cross-sectional views 600-1800 of some embodiments of a method of forming an IC device comprising an M-M and D-D bonding layer with shield structures at a bonding interface. The method may, for example, be employed to form the integrated chip of FIG. 1, 5A, or the like. Although FIGS. 6-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
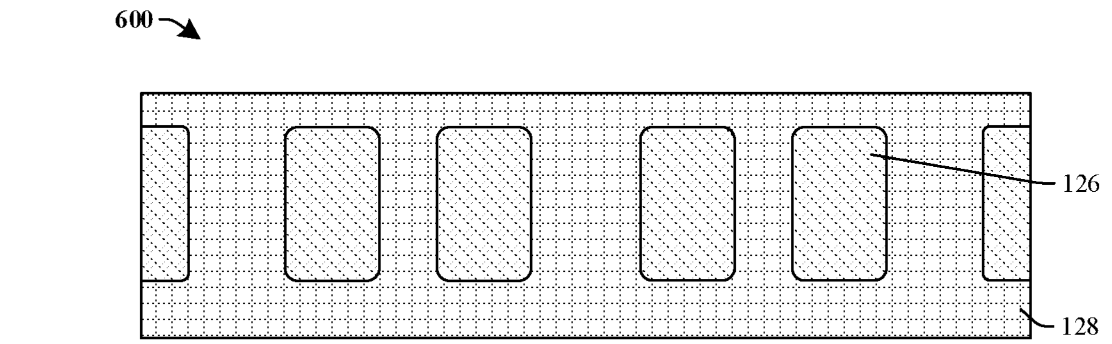
FIGS. 6-12, 13A, 13B, and 14-18 illustrate a series of cross-sectional views of some embodiments of a method for forming an IC device comprising an M-M and D-D bonding layer with shield structures at a bonding interface.

As shown in the cross-sectional view 600 of FIG. 6, a plurality of photodetectors 126 are formed in a first substrate 128. In some embodiments, the photodetectors 126 are formed through an implantation process. In further embodiments, a first masking layer (not shown) is formed over the first substrate 128 before the implantation process to protect portions of the first substrate 128 outside of the photodetectors 126 from dopants.

Figure 7:
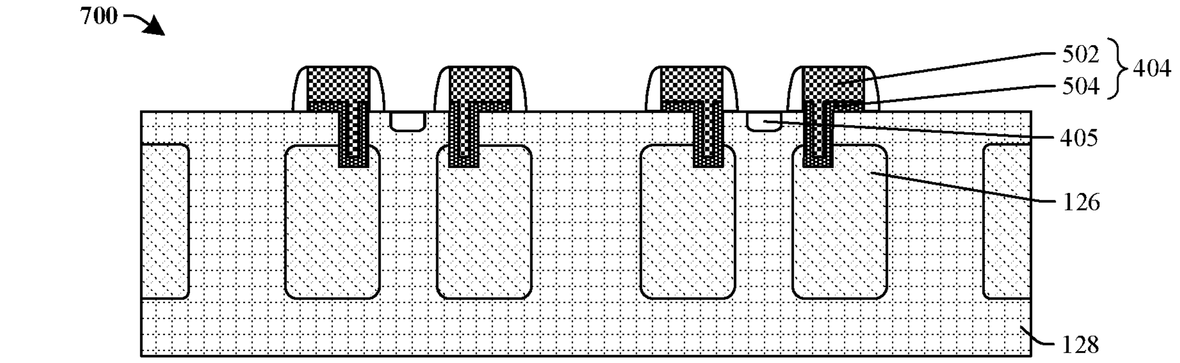

As shown in the cross-sectional view 700 of FIG. 7, a plurality of transfer transistors 404 and floating diffusion nodes 405 are formed on the first substrate 128. In some embodiments, the transfer transistors 404 are formed using one or more deposition steps to form layers corresponding to a plurality of gate dielectrics 504 and a plurality of gate electrodes 502. In further embodiments, one or more etching processes are performed to pattern the layers into the plurality of gate dielectrics 504 and the plurality of gate electrodes 502. In some embodiments, the plurality of floating diffusion nodes 405 are formed through an implantation process or some other suitable process.

Figure 8:
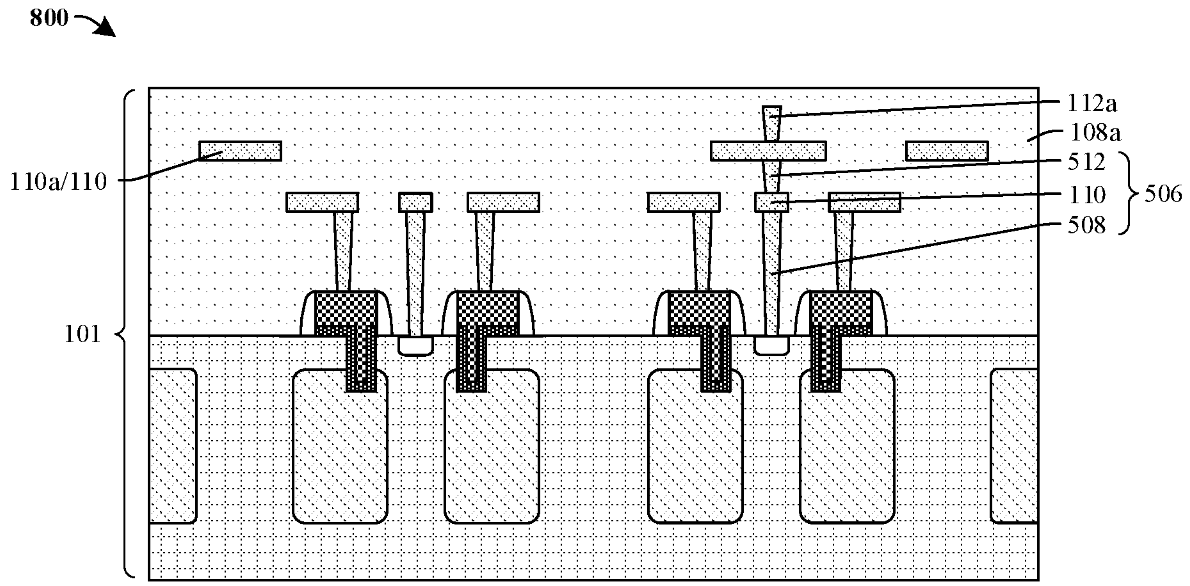

As shown in the cross-sectional view 800 of FIG. 8, a first interconnect structure 506, the first wire level 110*a*, and the first plurality of bond contacts 112*a* are formed in a first dielectric layer 108*a*. In some embodiments, the first interconnect structure 506, the first wire level 110*a*, and the first plurality of bond contacts 112*a* are formed by repeating a damascene process. The damascene process repeats layers of the first interconnect structure 506, the first wire level 110*a*, and the first plurality of bond contacts 112*a*.

The damascene process may, for example, comprise first depositing a portion of the first dielectric layer 108*a*. A mask is formed over the portion of the first dielectric layer 108*a* with a pattern of the mask corresponding to the features of the via level and/or the wire level to be formed. An etching step is then performed, removing portions of the first dielectric layer 108*a* to form openings (not shown) corresponding to the pattern of the mask. The mask is then stripped, and resulting openings are filled with a conductive material. In some embodiments, the conductive material is formed using chemical vapor deposition (CVD), physical vapor deposition (PVD), atomic layer deposition (ALD), sputtering, electrochemical plating, electroless plating, some other suitable deposition process, or a combination of the foregoing. In further embodiments, a planarization process is performed to remove excess conductive material from above the uppermost surface of the first dielectric layer 108*a*.

Also shown in the cross-sectional view 800 of FIG. 8, an additional portion of the first dielectric layer 108*a* is formed over the first plurality of bond contacts 112*a*, in order to form the conductive pads (e.g., 102 of FIG. 1A) of the first M-M and D-D bonding layer (e.g., 107 of FIG. 1A) hereafter. The resulting structure is hereafter referred to as a first IC chip 101.

Figure 9:
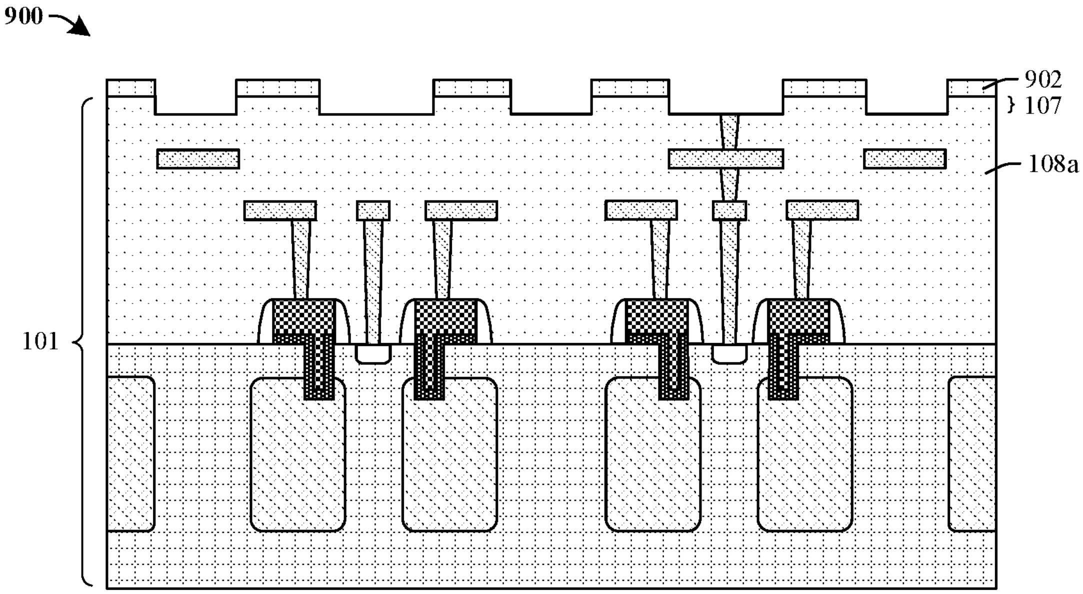

As shown in the cross-sectional view 900 of FIG. 9, a second mask 902 is formed over the first dielectric layer 108*a*. The second mask 902 has openings that correspond to the footprints (e.g., the lateral area) of both the conductive pads 102 of the first M-M and D-D bonding layer (e.g., 107 of FIG. 1A) and the shield lines 104. In some embodiments, where the first plurality of dummy pads (e.g., 106 of FIG. 1A) are to be formed hereafter, the openings of the second mask 902 further correspond to the first plurality of dummy pads 106. In some embodiments, the second mask 902 is or comprises silicon oxynitride and/or other suitable materials. In some embodiments, the second mask 902 is or comprises photoresist or other suitable materials, and/or is formed by photolithography or some other suitable process.

Figure 10:
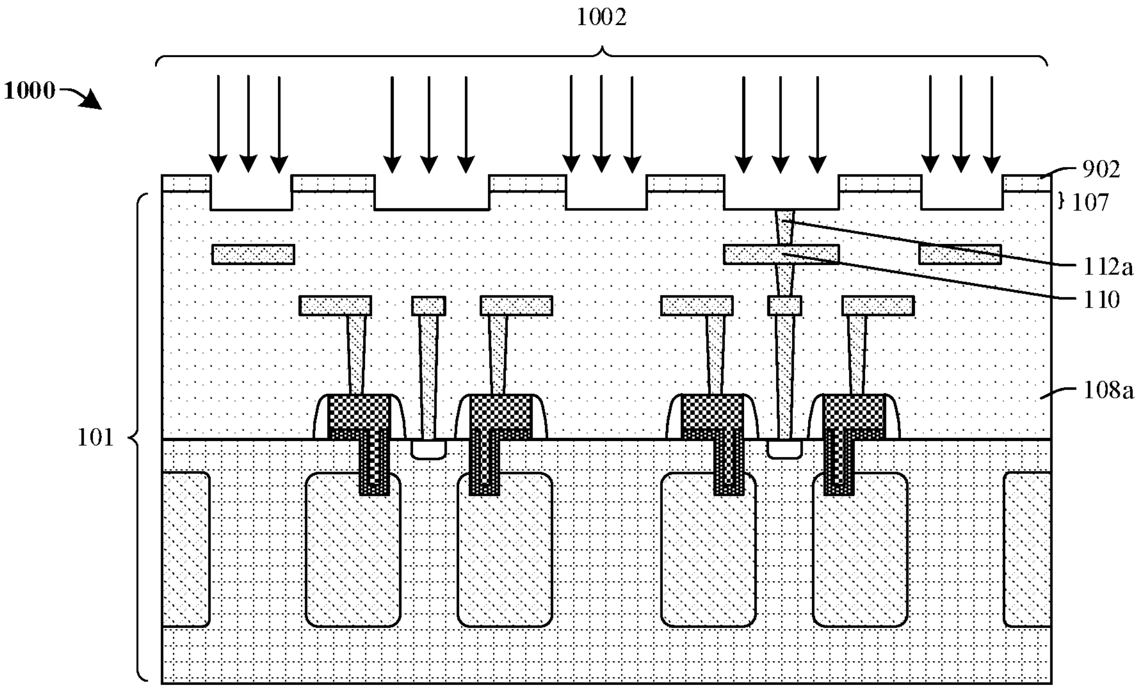

As shown in the cross-sectional view 1000 of FIG. 10, an etch 1002 is performed, thereby removing portions of the first dielectric layer 108*a* corresponding to the openings in the second mask 902. In some embodiments, the etch 1002 is a dry etching process (e.g., plasma dry etching). As a result, the first dielectric layer 108*a* has openings with a layout of the first M-M and D-D bonding layer 107 being formed.

Figure 11:
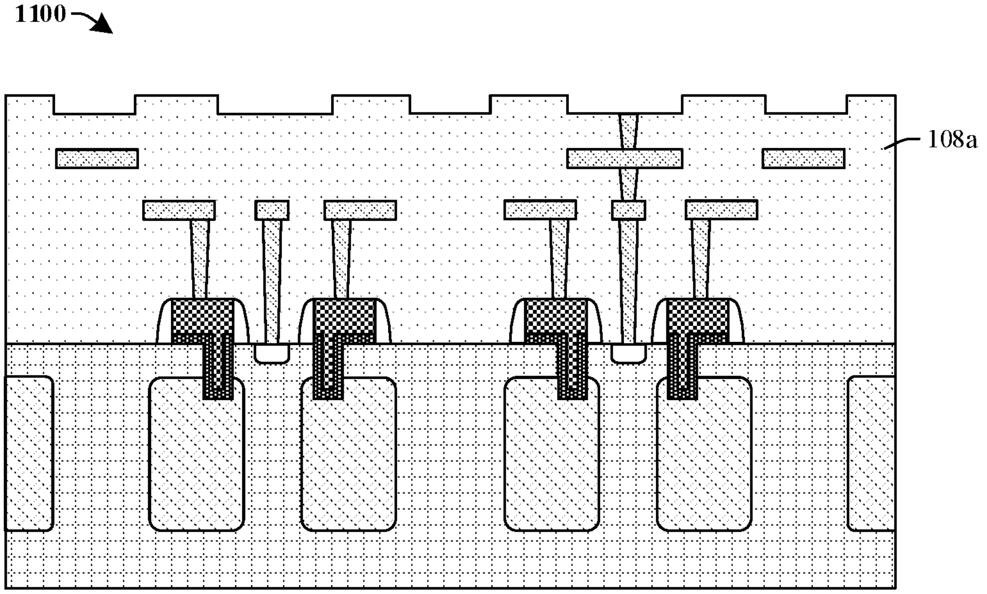

As shown in the cross-sectional view 1100 of FIG. 11, the second mask (e.g., 902 of FIG. 10) is removed, exposing the uppermost surface of the first dielectric layer 108*a*. In some embodiments, the second mask is removed using one or more stripping processes.

Figure 12:
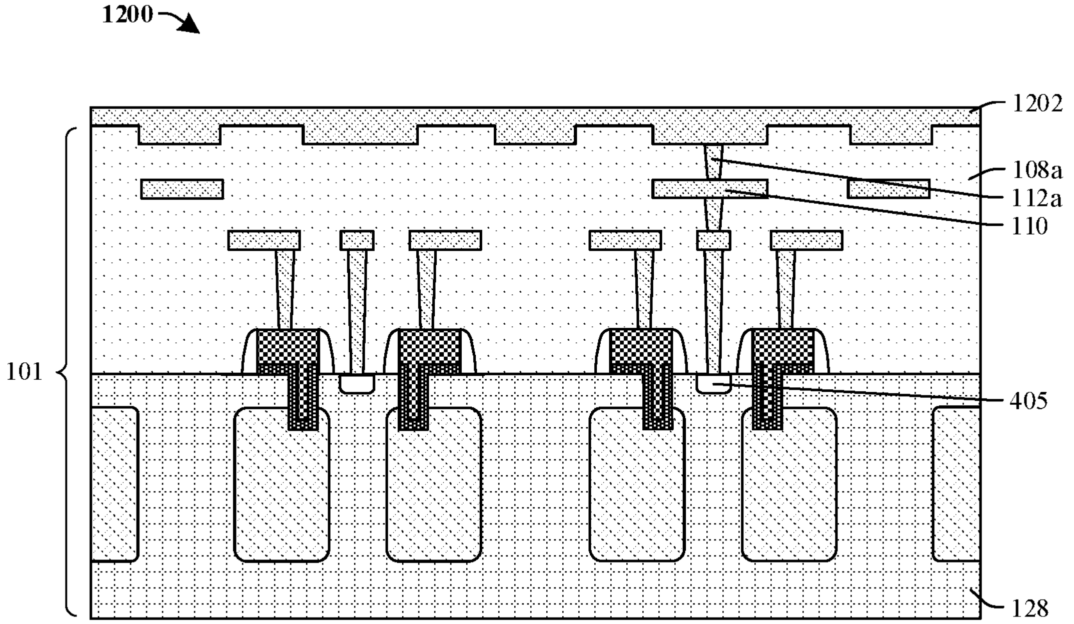

As shown in the cross-sectional view 1200 of FIG. 12, a conductive layer 1202 is deposited over the uppermost surface of the first dielectric layer 108*a*. In some embodiments, the conductive layer 1202 is deposited using CVD, PVD, ALD, some other process, or a combination of the foregoing.

Figure 13A:
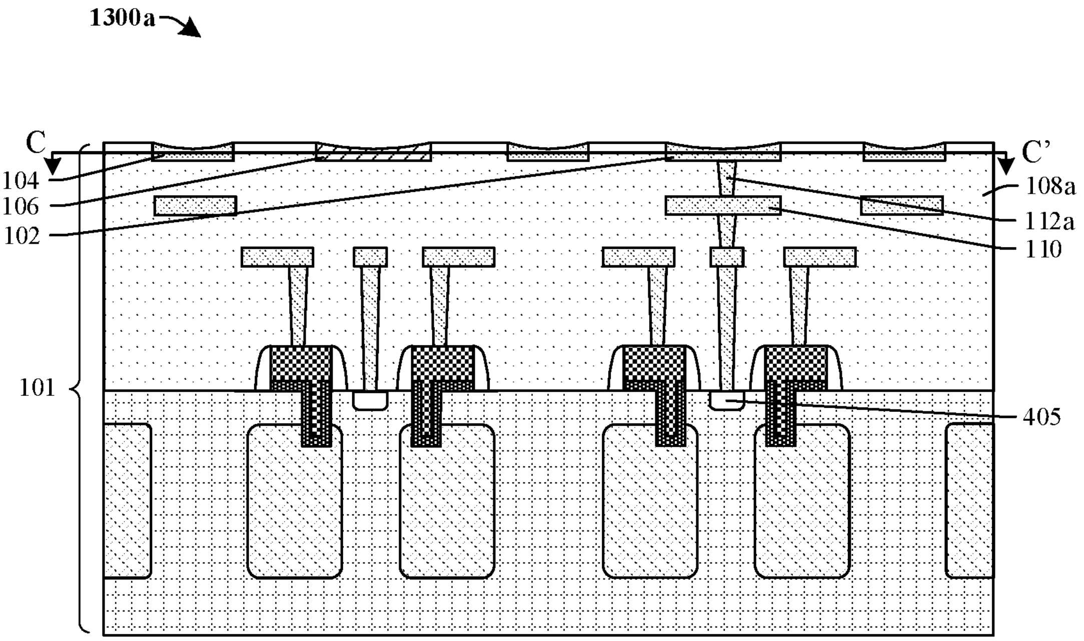
Figure 13B:
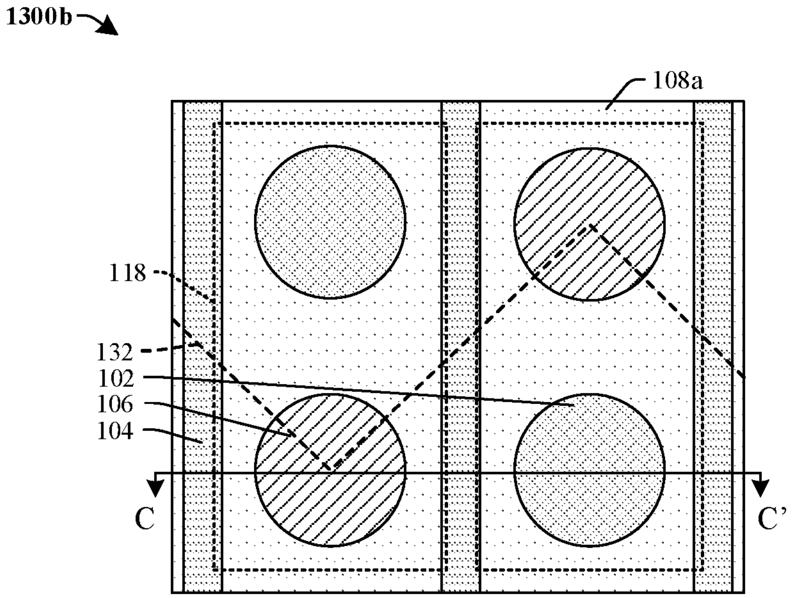

As shown in the cross-sectional and top layout views 1300*a*-1300*b* of FIGS. 13A and 13B, a planarization process (e.g., a chemical mechanical planarization (CMP) process or the like) is performed on the conductive layer (e.g., 1202 of FIG. 12). The planarization process removes portions of the conductive layer 1202 extending above the first dielectric layer 108*a* while leaving the conductive pads 102 and the shield lines 104 remaining on the first dielectric layer 108*a*. In further embodiments, the first plurality of dummy pads 106 also remain on the first dielectric layer 108*a* after the planarization process. In some embodiments, dishing causes upper surfaces of the conductive pads 102 and the shield lines 104 to be curved and extend below the uppermost surface of the first dielectric layer 108*a*.

While the plurality of conductive pads 102, the plurality of shield lines 104, and the plurality of dummy pads 106 are shown as being formed using the same mask (e.g., the second mask 902 of FIG. 9) and the same etch (e.g., the etch of FIG. 10), separate masks and etches may be used. 106. For example, the plurality of conductive pads 102 may be formed using one mask/etch process, whereas the plurality of shield lines 104 and the plurality of dummy pads 106 may be concurrently formed using another mask/etch process. As another example, the plurality of conductive pads 102 may be formed using one mask/etch process, the plurality of shield lines 104 may be formed using another mask/etch process, and the plurality of dummy pads 106 may be formed using yet another mask/etch process.

The one or more mask/etch processes result in the conductive pads 102 being separated by the first plurality of shield lines 104. In some embodiments, the dummy pads 106 further separate the conductive pads 102 from one another, and are organized in a zig-zag layout 132. The zig-zag layout 132 increases separation between the first plurality of conductive pads 102. Further, the first plurality of dummy pads 106 shield interference between neighboring conductive pads in the pad rows and in the pad columns. The increased separation and the shielding reduce interference between the first plurality of conductive pads 102, resulting in the image acquired by the image sensor having potentially higher quality.

Figure 14:
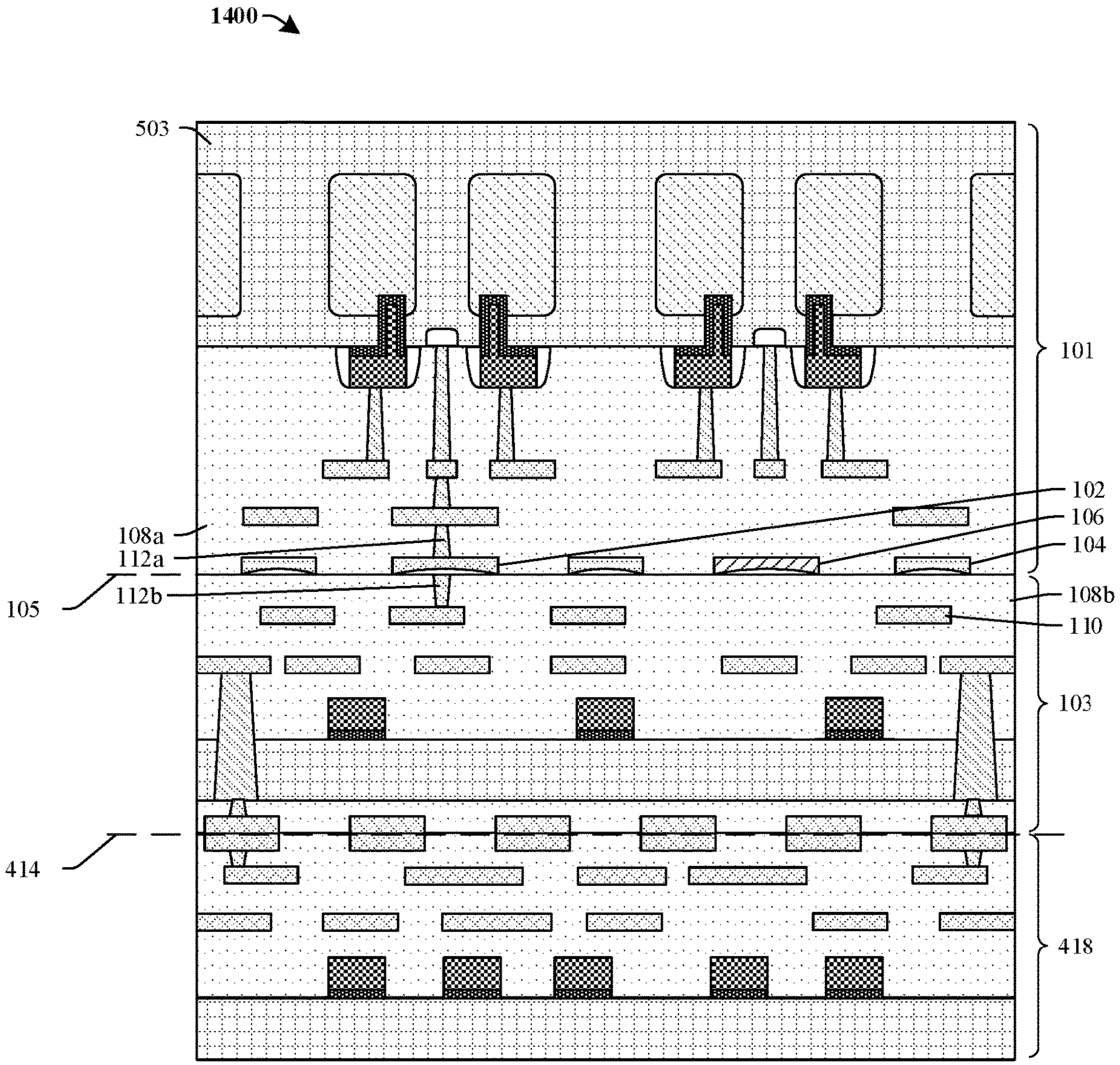

As shown in the cross-sectional view 1400 of FIG. 14, the first IC chip 101 is bonded with a second IC chip 103 and a third IC chip 418. The bonding process comprises aligning the first IC chip 101 with the second IC chip 103, then applying pressure to the center of either the first IC chip 101 or the third IC chip 418, resulting in the bonding of the first dielectric layer 108*a* to the second dielectric layer 108*b* (e.g., through van der Waals forces).

Figure 15:
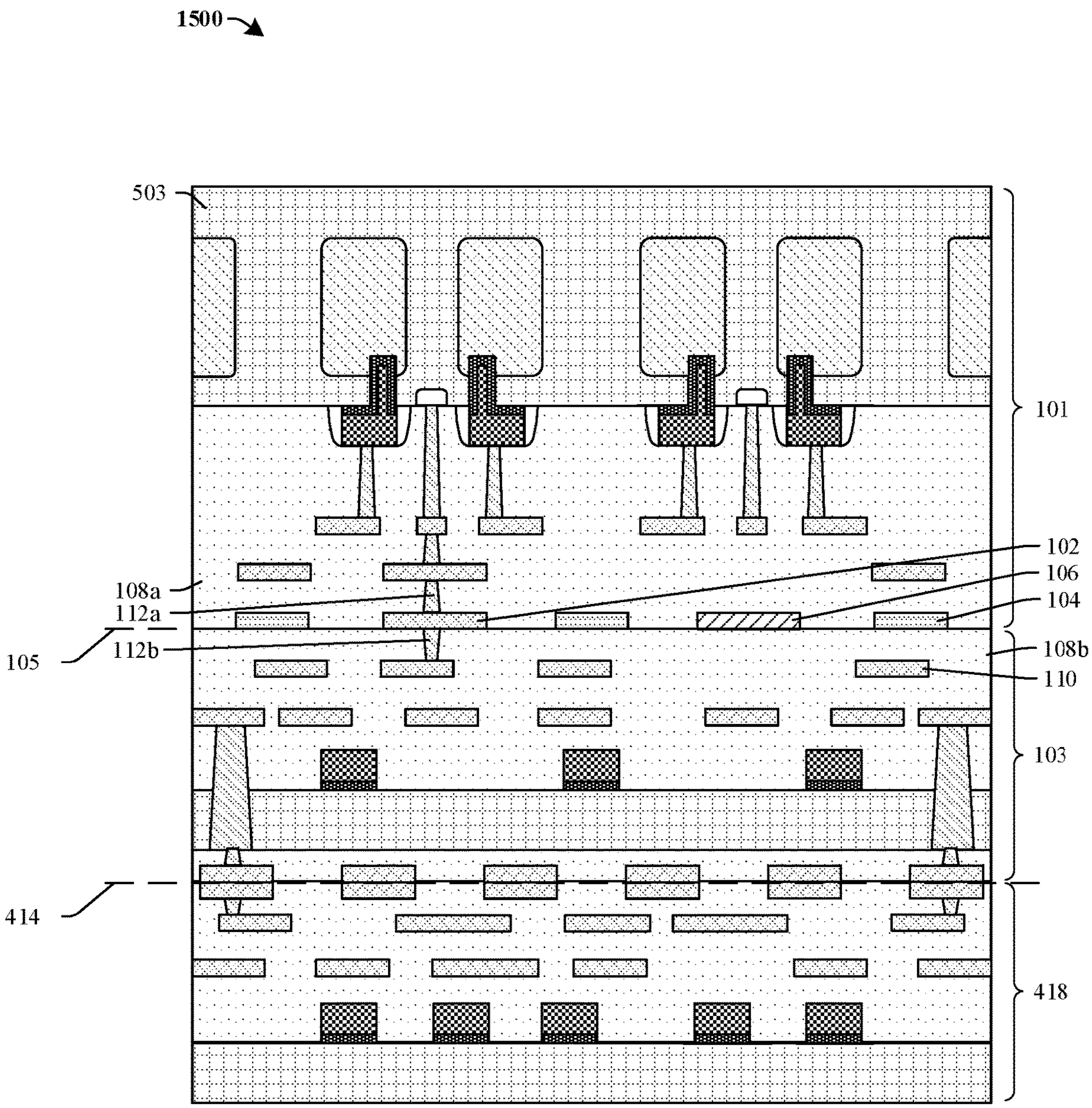

As shown in the cross-sectional view 1500 of FIG. 15, an anneal is performed, causing the conductive pads 102 and the shield lines 104 to expand and contact the second IC chip 103. The expansion and higher temperatures of the conductive pads 102 results in the conductive pads 102 bonding with the second plurality of bond contacts 112*b*, strengthening the bond between the first IC chip 101 and the second IC chip 103.

Figure 16:
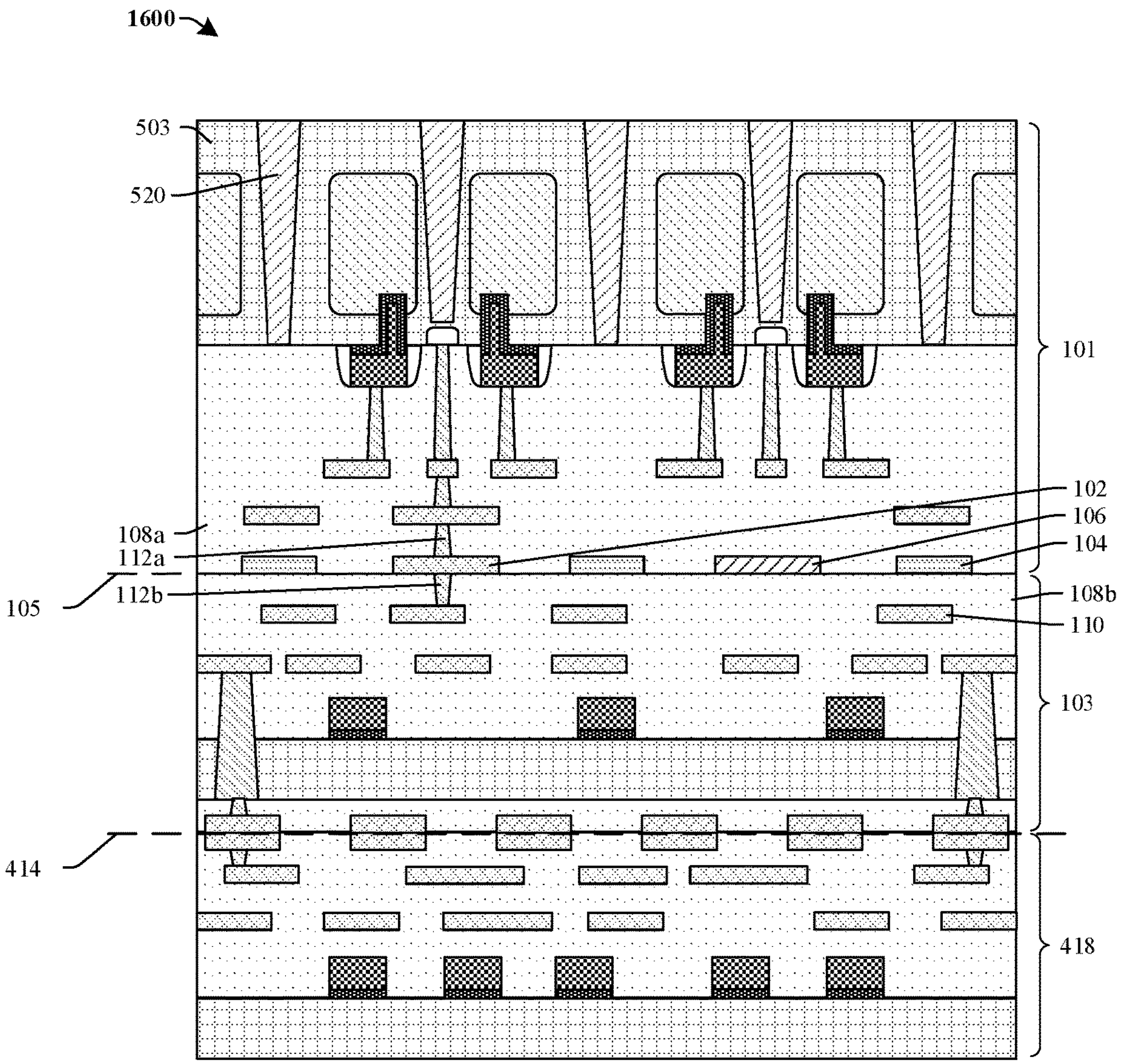

As shown in the cross-sectional view 1600 of FIG. 16, a BDTI structure 520 is formed from a side of the substrate 503 opposite of the transfer transistors 404. The BDTI structure 520 is extends into the substrate 503 and separates the photodetectors 126 from one another. The BDTI structure 520 is formed by etching one or more openings (not shown) into the substrate, and then performing one or more deposition processes to fill the openings. The BDTI structure 520 is or comprises a high-k dielectric and/or some other suitable dielectric(s).

Figure 17:
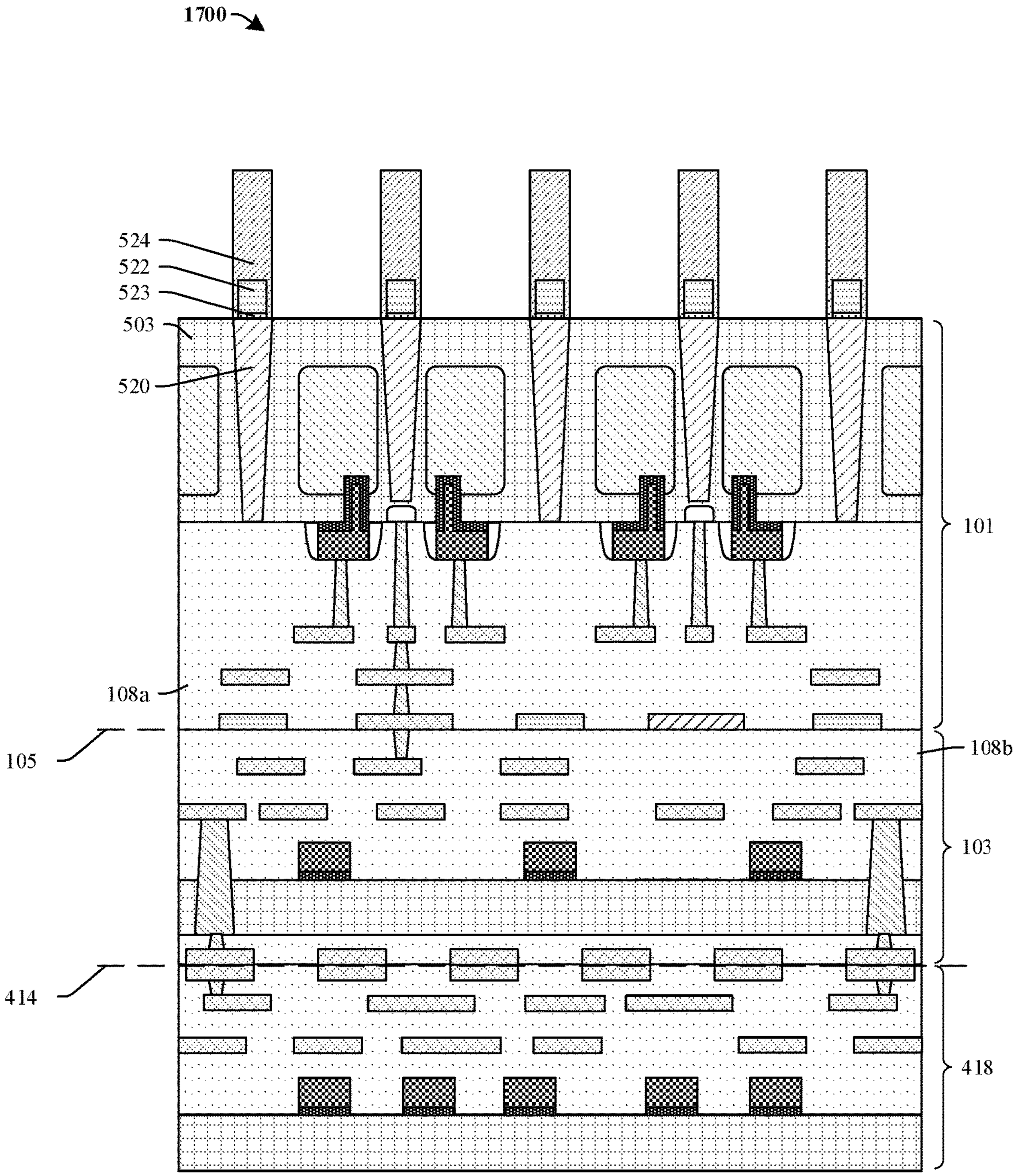

As shown in the cross-sectional view 1700 of FIG. 17, a BSMG 522 is formed over exposed surfaces of the BDTI structure 520, along with a grid of dielectric material 524. In some embodiments, a barrier layer 523 is formed between the BSMG 522 and the BDTI structure 520. The BSMG 522 and the barrier layer 523 are formed by depositing the barrier layer 523 and a metal layer (not shown) over the substrate 503, and then patterning the barrier layer 523 and the metal layer to form a grid shape. The grid of dielectric material 524 is then formed by depositing a conformal layer of dielectric material (not shown) and then patterning the conformal layer into a grid surrounding the BSMG 522.

Figure 18:
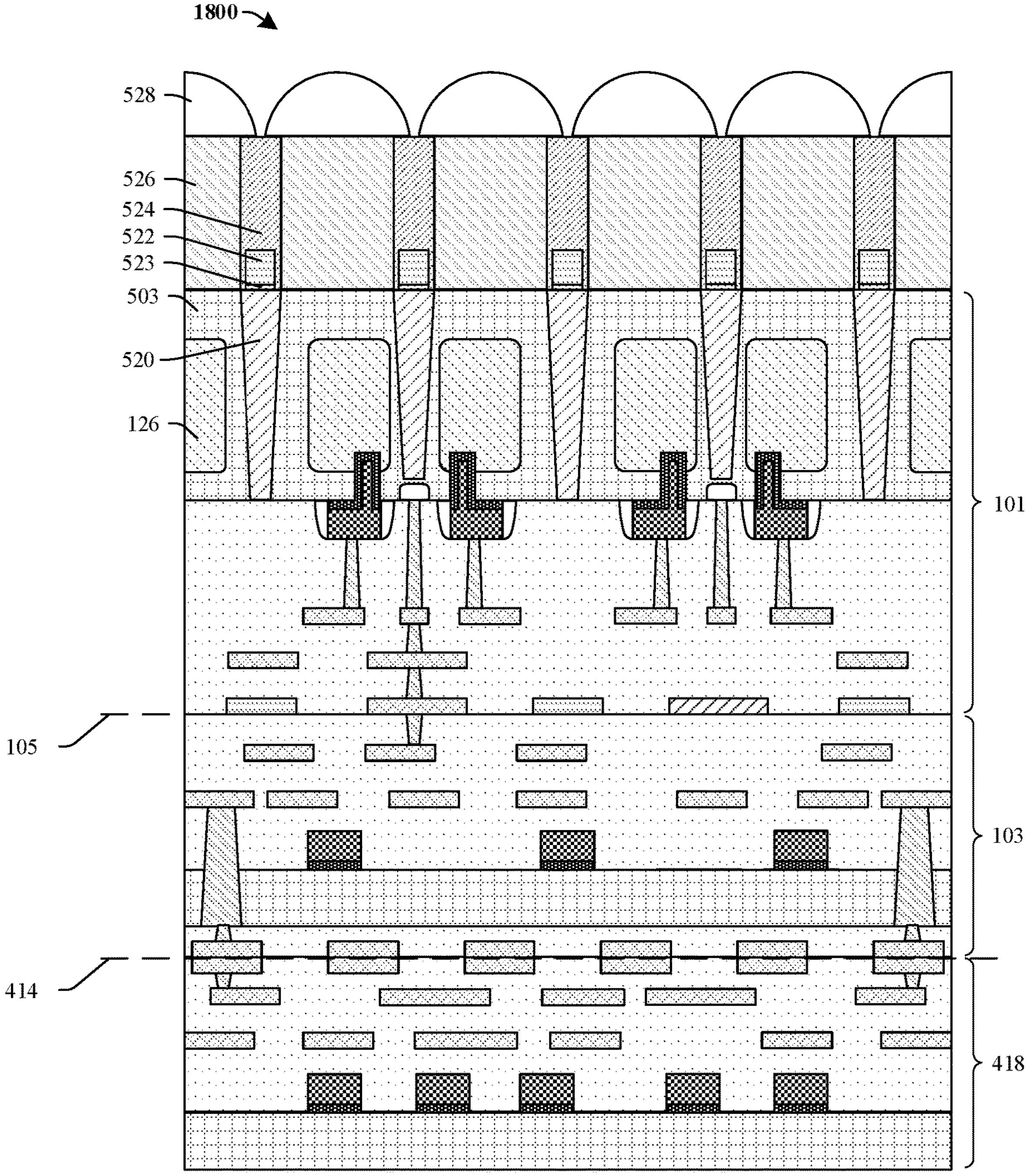

As shown in the cross-sectional view 1800 of FIG. 18, a plurality of color filters 526 is formed within the grid of dielectric material 524 and overlies the photodetectors 126. In some embodiments, a plurality of micro-lenses 528 is formed over the color filters 526.

Figure 19:
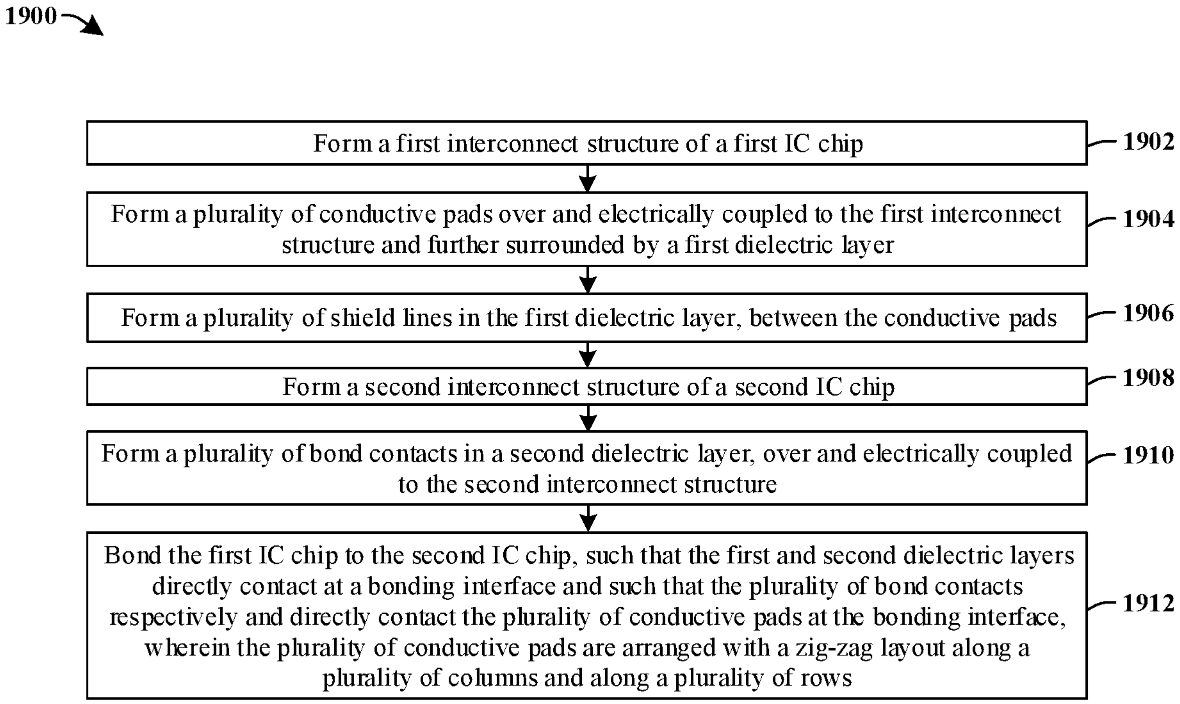
FIG. 19 illustrates a flow diagram of some embodiments of a method for forming an IC device comprising an M-M and D-D bonding layer with shield structures.

FIG. 19 illustrates a flow diagram 1900 of some embodiments of a method for forming an IC device comprising an M-M and D-D bonding layer with shield structures.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1902, a first interconnect structure of a first IC chip is formed. See, for example, FIG. 6.

At 1904, a plurality of conductive pads are formed over and electrically coupled to the first interconnect structure and further surrounded by a first dielectric layer. See, for example, FIG. 8.

At 1906, a plurality of shield lines are formed in the first dielectric layer, between the conductive pads. See, for example, FIGS. 9-13.

At 1908, a second interconnect structure of a second IC chip is formed. See, for example, FIGS. 9-13.

At 1910, a plurality of bond contacts is formed in a second dielectric layer, over and electrically coupled to the second interconnect structure. See, for example, FIG. 14.

At 1912, the first IC chip is turned over and placed onto the second IC chip such that the plurality of conductive pads are facing the second plurality of bond contacts. See, for example, FIG. 14.

At 1914, the first IC chip is bonded to the second IC chip, such that the first and second dielectric layers directly contact at a bonding interface and such that the plurality of bond contacts respectively and directly contact the plurality of conductive pads at the bonding interface, wherein the plurality of conductive pads are arranged with a zig-zag layout along a plurality of columns and along a plurality of rows. See, for example, FIGS. 14-15.

Therefore, the present disclosure relates to a method of forming an IC device comprising an M-M and D-D bonding layer with shield structures.

Some embodiments relate to an IC device, including a first IC chip; and a second IC chip bonded to the first IC chip at a bonding interface; where the first and second IC chips respectively comprise a first dielectric layer and a second dielectric layer directly contacting at the bonding interface; the first IC chip further comprises a plurality of conductive pads recessed into the first dielectric layer and in a plurality of rows and a plurality of columns; where the plurality of conductive pads are arranged with a zig-zag layout along the plurality of columns and along the plurality of rows and comprise a first conductive pad and a second conductive pad; the first IC chip further comprises a first shield line in the first dielectric layer and laterally between the first and second conductive pads, and the second IC chip further comprises a contact recessed into the second dielectric layer and directly contacting the first conductive pad at the bonding interface.

In other embodiments, the present disclosure relates to an IC device, including a first IC chip; a second IC chip bonded to the first IC chip at a bonding interface; and a pixel arranged across the first IC chip and the second IC chip and comprising a first photodetector subarray and a second photodetector subarray, wherein the first and second IC chips respectively comprise a first dielectric layer and a second dielectric layer directly contacting at the bonding interface, the first IC chip further comprises a first conductive pad and a first dummy pad recessed into the first dielectric layer and at the bond interface, the first conductive pad underlies the first photodetector subarray, the first dummy pad underlies the second photodetector subarray, and the second IC chip further comprises a contact recessed into the second dielectric layer and directly contacting the first conductive pad at the bonding interface.

In yet other embodiments, the present disclosure relates to a method of forming an integrated circuit (IC) device including forming a first interconnect structure of a first IC chip; forming a plurality of conductive pads over and electrically coupled to the first interconnect structure and further surrounded by a first dielectric layer; forming a plurality of shield lines in the first dielectric layer, between the conductive pads; forming a second interconnect structure of a second IC chip; forming a plurality of bond contacts in a second dielectric layer, over and electrically coupled to the second interconnect structure; bonding the first IC chip to the second IC chip, such that the first and second dielectric layers directly contact at a bonding interface and such that the plurality of bond contacts respectively and directly contact the plurality of conductive pads at the bonding interface; wherein the plurality of conductive pads are arranged with a zig-zag layout along the plurality of columns and along the plurality of rows.

It will be appreciated that in this written description, as well as in the claims below, the terms “first”, “second”, “second”, “third” etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC) device, comprising:

forming a first interconnect structure of a first IC chip;

forming a plurality of conductive pads over and electrically coupled to the first interconnect structure and further surrounded by a first dielectric layer;

forming a plurality of dummy pads isolated from the first interconnect structure between the plurality of conductive pads;

forming a plurality of shield lines in the first dielectric layer, between the plurality of conductive pads;

forming a second interconnect structure of a second IC chip;

forming a plurality of bond contacts in a second dielectric layer, over and electrically coupled to the second interconnect structure; and bonding the first IC chip to the second IC chip, wherein the first dielectric layer and the second dielectric layer directly contact at a bonding interface and wherein the plurality of bond contacts respectively and directly contact the plurality of conductive pads at the bonding interface;

wherein the plurality of conductive pads are arranged with a zig-zag layout along a plurality of columns and along a plurality of rows, and wherein from a cross-sectional view along a first direction, a first conductive pad in a first row of the plurality of rows is separated from a second conductive pad in the first row by two shield lines of the plurality of shield lines and a dummy pad of the plurality of dummy pads.

2. The method of claim 1, wherein the second conductive pad is the closest conductive pad to the first conductive pad in the first row and in the first direction.

3. The method of claim 1, wherein the plurality of dummy pads are at the bonding interface and are evenly spaced between the plurality of conductive pads, wherein a first dummy pad of the plurality of dummy pads is substantially equidistant from four conductive pads of the plurality of conductive pads, and wherein a first pair of the four conductive pads is spaced from the first dummy pad by two shield lines in the first direction, and wherein a second pair of the four conductive pads is spaced from the first dummy pad in a second direction perpendicular to the first direction and spaced from the plurality of shield lines in the first direction.

4. The method of claim 1, wherein the plurality of shield lines and the plurality of dummy pads are concurrently formed with the plurality of conductive pads, wherein the plurality of shield lines space the plurality of columns, and wherein the plurality of columns comprise both the plurality of conductive pads and the plurality of dummy pads in the first direction.

5. The method of claim 1, wherein the first row of the plurality of rows that has the first conductive pad extends parallel to the first direction, wherein conductive pads and dummy pads are alternately positioned along the first row, and wherein in a first column having the first conductive pad and extending parallel to a second direction that is perpendicular to the first direction, conductive pads and dummy pads are alternately positioned along the first column.

6. The method of claim 5, wherein the dummy pads in the first column are spaced from dummy pads in a second column by a first shield line.

7. The method of claim 5, further comprising forming a plurality of photodetectors in a substrate before forming the first interconnect structure over the substrate, wherein the plurality of photodetectors are arranged in a pixel block of a pixel block row extending in the first direction, wherein the first row and a second row of the plurality of rows of the plurality of conductive pads extend over the pixel block, and wherein the first conductive pad of the first row is coupled to the pixel block while a first dummy pad of the second row overlies the pixel block and is isolated from the first interconnect structure.

8. The method of claim 5, wherein the plurality of shield lines extend in the second direction between the columns and are spaced in the first direction by the columns.

9. A method of forming an integrated device, comprising:

forming a first interconnect structure on a first substrate comprising a plurality of wires separated by a first dielectric layer;

forming a plurality of conductive pads on the first dielectric layer in a plurality of rows extending in a first direction and a plurality of columns extending in a second direction perpendicular to the first direction;

forming a plurality of dummy pads isolated from the first interconnect structure between the plurality of conductive pads;

forming a first plurality of shield lines in the first dielectric layer extending between conductive pads of the plurality of conductive pads, wherein from a cross-sectional view along the first direction, a first conductive pad in a first row of the plurality of rows is separated from a second conductive pad in the first row by two shield lines of the first plurality of shield lines and a dummy pad of the plurality of dummy pads;

forming a plurality of bond contacts in a second dielectric layer on a second substrate; and bonding the plurality of conductive pads to the plurality of bond contacts at a bonding interface.

10. The method of claim 9, further comprising:

forming a second plurality of shield lines in the second dielectric layer, wherein the second plurality of shield lines are level with the plurality of bond contacts; and bonding the first plurality of shield lines to the second plurality of shield lines concurrently with bonding the plurality of conductive pads to the plurality of bond contacts.

11. The method of claim 10, wherein after the first plurality of shield lines are bonded to the second plurality of shield lines, a first shield line of the first plurality of shield lines is a first distance in the first direction from a first conductive pad, a second shield line of the second plurality of shield lines that is bonded to the first shield line is a second distance in the first direction from a bond contact bonded to the first conductive pad, and the first distance is less than the second distance.

12. The method of claim 9, wherein the plurality of dummy pads are formed concurrently with the plurality of conductive pads.

13. The method of claim 12, wherein the plurality of dummy pads are positioned between the plurality of conductive pads in the plurality of rows and the plurality of columns, resulting in a conductive pad of a first row of the plurality of rows being separated from a nearest conductive pad in the first row by a first dummy pad of the plurality of dummy pads and first and second shield lines of the first plurality of shield lines that extend across the first row.

14. The method of claim 9, further comprising:

forming a plurality of photodetectors in the first substrate before forming the first interconnect structure; and forming a plurality of floating diffusion nodes and transfer transistors at a first side of the first substrate, wherein the transfer transistors respectively couple the plurality of photodetectors to floating diffusion nodes of the plurality of floating diffusion nodes, wherein the first interconnect structure is coupled to the plurality of floating diffusion nodes, wherein a first conductive pad of the plurality of conductive pads is coupled to the plurality of floating diffusion nodes by the first interconnect structure, and wherein a first dummy pad of the plurality of dummy pads is laterally aligned with a floating diffusion node that is coupled to the first conductive pad.

15. A method of forming an integrated device, comprising:

forming a plurality of photodetectors in a substrate;

forming a plurality of floating diffusion nodes between the plurality of photodetectors in the substrate comprising a first floating diffusion node and a second floating diffusion node;

forming an interconnect structure over the substrate and coupled to the plurality of floating diffusion nodes;

forming a plurality of conductive pads coupled to the interconnect structure, wherein the plurality of conductive pads respectively lie within pixel blocks of a plurality of pixel blocks in a first pixel block row extending in a first direction, and wherein the plurality of conductive pads comprise a first conductive pad that is coupled to the first floating diffusion node and the second floating diffusion node by the interconnect structure;

forming a plurality of dummy pads isolated from the interconnect structure between the plurality of conductive pads;

forming a first plurality of shield lines concurrently with the plurality of conductive pads and extending between the pixel blocks in the first pixel block row; and bonding the plurality of conductive pads to a plurality of bond contacts on a second substrate, wherein from a cross-sectional view along the first direction, a first conductive pad in a first row of a plurality of rows is separated from a second conductive pad in the first row by two shield lines of the first plurality of shield lines and a dummy pad of the plurality of dummy pads.

16. The method of claim 15, wherein the plurality of dummy pads comprises a first dummy pad directly over the second floating diffusion node and isolated from the interconnect structure, wherein the plurality of conductive pads and the plurality of dummy pads extend in a first pad row and a second pad row aligned with the first pixel block row and extending in the first direction, wherein the plurality of dummy pads alternate between being positioned in the first pad row and the second pad row along a length of the first pixel block row, and wherein the plurality of conductive pads alternate between being positioned in the first pad row and the second pad row along the length of the first pixel block row, resulting in conductive pads in the first pixel block row that are closest to the first conductive pad being in a different pad row from the first conductive pad.

17. The method of claim 15, wherein the first conductive pad is within a first pixel block of the first pixel block row, wherein a second conductive pad is within a second pixel block of the first pixel block row, and wherein the first conductive pad and the second conductive pad are respectively formed off-center from centers of the first pixel block and the second pixel block in a second direction perpendicular to the first direction, resulting in the first conductive pad and the second conductive pad being spaced in the first direction and the second direction.

18. The method of claim 15, wherein the pixel blocks comprise 2-by-4 arrays of photodetectors, and wherein a 2-by-2 subarray is coupled to the first floating diffusion node and a second 2-by-2 subarray is coupled to the second floating diffusion node, wherein the first conductive pad is directly over the first floating diffusion node, and wherein the first conductive pad is spaced from the second floating diffusion node in a second direction perpendicular to the first direction.

19. The method of claim 18, wherein the plurality of conductive pads of the first pixel block row are coupled to multiple floating diffusion nodes, and are positioned directly over floating diffusion nodes laterally aligned with alternating pad rows.

20. The method of claim 19, wherein the plurality of dummy pads are arranged in two pad rows within the first pixel block row that extend parallel to the first direction, and wherein the plurality of dummy pads are positioned directly over floating diffusion nodes that are laterally aligned with alternating pad rows of the two pad rows.

* * * * *